United States Patent [19]
Noguchi

[11] Patent Number: 6,005,270
[45] Date of Patent: Dec. 21, 1999

[54] SEMICONDUCTOR NONVOLATILE MEMORY DEVICE AND METHOD OF PRODUCTION OF SAME

[75] Inventor: Takashi Noguchi, Kanagawa, Japan

[73] Assignee: Sony Corporation, Tokyo, Japan

[21] Appl. No.: 09/188,233

[22] Filed: Nov. 9, 1998

[30] Foreign Application Priority Data

Nov. 10, 1997 [JP] Japan ................................. 9-307667

[51] Int. Cl.⁶ .................................................. H01L 29/72
[52] U.S. Cl. ............................... 257/315; 257/20; 257/30; 257/43; 257/316; 257/321; 257/337; 257/390; 257/401
[58] Field of Search ................................. 257/20, 30, 43, 257/315, 316, 321, 337, 390, 401

[56] References Cited

U.S. PATENT DOCUMENTS 5,691,552  11/1997  Oyama ..................................... 257/316

FOREIGN PATENT DOCUMENTS 10-41234   2/1998  Japan .
10-261799  9/1998  Japan .

*Primary Examiner*—Edward Wojciechowicz
*Attorney, Agent, or Firm*—Ronald P. Kananen; Rader, Fishman & Grauer

[57] ABSTRACT

A semiconductor nonvolatile memory device capable of lowering an operation voltage such as an erase voltage and capable of lowering costs and a method of production of the same, wherein a thin film transistor acting as the memory transistor is formed with a semiconductor layer 31b having a channel formation region formed on an insulating substrate 10 made of glass or plastic, a charge storing layer 32a formed on the semiconductor layer, a control gate 33a formed above the charge storing layer, and source and drain regions formed connected to the channel formation region.

76 Claims, 14 Drawing Sheets

SEMICONDUCTOR NONVOLATILE MEMORY DEVICE AND METHOD OF PRODUCTION OF SAME

BACKGROUND OF THE INVENTION

1. Field of the Invention

The present invention relates to a semiconductor nonvolatile memory device and a method of production of the same, more particularly relates to a semiconductor nonvolatile memory device having a charge storing layer for storing a charge between a gate electrode of a transistor and a channel formation region and to a method of production of the same.

2. Description of the Related Art

At the present time, semiconductor nonvolatile memory devices are being actively developed. Research and development are being conducted in various structures and configurations primarily focusing on flash memories of a floating gate structure. Flash memories may be roughly classified into a NAND type and a NOR type array from the viewpoint of the cell configuration.

Among the above, the NAND type array connects a plurality of memory cells in series and has common selection transistors and bit lines. For example, when connecting eight memory cells, ½ of a contact for data input/output is shared by eight memory cells and therefore there is 1/16 of a contact per cell. Similarly, selection gates and a source line are all shared by the eight cells. Accordingly, as described above, the surface area per cell becomes close to the area occupied by a memory transistor and therefore the area of the memory cell is very small. Random access is not possible because of the structure, but it is advantageous in the points of the increased degree of integration, the increased capacity, and accordingly the lowered costs. For AV (audio and video) use or for data storage use or other applications, low priced, large capacity flash memories are sought. They are suited for example for replacing magnetic recording means such as HDD's (hard disk drives).

On the other hand, in the NOR type array, due to its structure, there is ½ of a contact per cell. This is disadvantageous in the point of the degree of integration in comparison with the NAND type array, but has the advantage that high speed random access reading is possible. For high speed reading applications, this may be expected to become part of the main memories in the future. The above NAND type or NOR type memory transistors may be of the floating gate type or an SIOS (or MONOS) type.

A table comparing the various performances of the NAND type and the NOR type array is shown next.

TABLE 1

| | Read speed | Random access | Write method | Erase method | Degree of integration |
|---|---|---|---|---|---|
| NAND type | Slow | Poor | FN | FN | Good |
| NOR type | Fast | Good | CHE | FN | Fair |

FN: Fowler Nordheim type tunnel injection
CHE: Channel hot electron type tunnel injection Here, a circuit diagram of a NOR type memory cell is shown in FIG. 15. In the erasing of data, a low voltage Vcg is supplied to a control gate CG, a high voltage Vs is supplied to a source S, and a bit line B and a substrate Sub are made open. By this, due to the Fowler Nordheim type tunneling phenomenon, electrons in the floating gate are drained and the data is erased. As this erasure, batch erasing for every erasing sector is possible.

On the other hand, in a NAND type memory cell, as shown in FIG. 16, for example eight memory transistors are connected in series to constitute a NAND column. Selection transistors for selecting the present NAND column are formed at the two end portions. As the method of erasing data of the NAND type memory cell, 0V is supplied to all control gates CG of the NAND column, and a high voltage (for example 20V) is supplied to selection gates SG1 and SG2 of the two selection transistors and the substrate Sub. Further, the source S and the bit line B are made open. By this, in the same way as the NOR type array, due to the Fowler Nordheim type tunneling phenomenon, electrons in the floating gate are drained, and the data of the entire NAND column is erased together.

However, in the semiconductor nonvolatile memory device of the related art, in the erase operation of data described above, it has been necessary to apply a high voltage as an operating voltage.

Further, along with the increase of the degree of integration and the enlargement of capacity of devices, a reduction of costs has been demanded. Particularly, lowering of costs is an indispensable condition in order to replace magnetic recording means.

SUMMARY OF THE INVENTION

The present invention was made in consideration with the above problem. Accordingly, the present invention has as its object to provide a semiconductor nonvolatile memory device capable of lowering the erase voltage and other operating voltages and capable of lowering costs and a method of production of the same.

To attain the above object, a semiconductor nonvolatile memory device of the present invention is a semiconductor nonvolatile memory device in which memory transistors having charge storing layers are connected, formed with a plurality of thin film transistors, each transistor comprising a semiconductor layer having a channel formation region formed in an insulating substrate of glass or plastic, a charge storing layer formed in the semiconductor layer, a control gate formed at an upper layer of the charge storing layer, and source and drain regions formed in the semiconductor layer and connected to the channel formation region, each thin film transistor acting as a memory transistor.

The semiconductor nonvolatile memory device of the present invention described above has a field effect type memory transistor having a charge storing layer between the control gate and the channel formation region in the semiconductor layer. The charge storing layer has a function of holding a charge. A Fowler Nordheim type tunnel current is produced by supplying a suitable voltage to the control gate and the semiconductor layer, and electrons are injected from the semiconductor layer into the charge storing layer, or electrons are discharged from the charge storing layer to the semiconductor layer. When a charge is stored in the charge storing layer, an electric field is caused by the stored charge, therefore the threshold voltage of the memory transistor changes. Due to this change, storage of data becomes possible. For example, data may be erased by storing a charge in the charge storing layer, and data may be written by discharging the charge stored in the charge storing layer.

In the semiconductor nonvolatile memory device of the present invention described above, as a low price and high precision transistor, a thin film transistor (hereinafter referred to as a "TFT") is formed having a charge storing layer between the control gate and the channel formation region in the semiconductor layer on a low cost substrate such as a glass substrate or a plastic substrate. As the substrate for forming a TFT, when comparing with a size of for example 8 inches Ø (150×150 mm$^2$), a glass substrate has a price of about $1/15$ of that of a usual silicon wafer. Further, in contrast to the fact that the surface area of a rectangular glass substrate of 300×400 mm$^2$ used for a liquid crystal display is about 5 times that of a silicon wafer of 8 inches Ø, the price is about $1/8$ of the same. This means that the substrate is de facto priced at about $1/40$ the price. Also, for plastic substrates, it is expected that the price will be lowered in the future. Accordingly, a semiconductor non-volatile memory device using TFTs as the memory transistors can use the above cheap substrates to realize a great reduction of costs.

Further, a TFT formed on a glass substrate or other insulating substrate can make a junction capacity of the transistor substantially zero and is a full depletion type, therefore the depletion layer capacitance is negligibly small—which is advantageous in the point of the read speed (ON bit sensing). Further, the gate swing value is determined by only a trap density in the semiconductor layer, a sharp inversion characteristic is obtained, and it is possible to obtain a memory transistor which can reduce the erase voltage and other voltages and operate at a high speed.

In the semiconductor nonvolatile memory device of the present invention described above, preferably the semiconductor layer is formed by polycrystalline silicon or quasi single crystal silicon. Here, "quasi single crystal silicon" means a silicon crystallized film comprised of a group of roughly block shaped silicon single crystal grain arranged on a substrate in a checkerboard manner where a selection orientation of each silicon single crystal grain with respect to the surface of the substrate is substantially the (100) plane, (111) plane or (110) plane and the interfaces of the silicon single crystal grains form a state close to lattice alignment and has electrically uniform, excellent characteristics in comparison with polycrystalline silicon. As the method of production of the same, use can be made of the methods disclosed in Japanese Patent Application No. 9-064036 and Japanese Patent Application No. 9-088728. As the layer serving as the channel formation region of the TFT, polycrystalline silicon or quasi single crystal silicon can provide a high performance semiconductor layer which can reduce the trap density in the film and reduce the gate swing value by excimer laser annealing (hereinafter referred to as "ELA") and other low temperature processes suited for formation on a glass substrate or plastic substrate.

Further, to attain the above object, the semiconductor nonvolatile memory device of the present invention is a semiconductor nonvolatile memory device in which memory transistors having charge storing layers are connected, formed with a plurality of thin film transistors, each transistor comprising a semiconductor layer formed by quasi single crystal silicon having a channel formation region formed in an insulating substrate of a silicon substrate covered on its surface with a silicon oxide film, a charge storing layer formed in the semiconductor layer, a control gate formed at an upper layer of the charge storing layer, and source and drain regions formed in the semiconductor layer and connected to the channel formation region, each thin film transistor acting as a memory transistor.

The above semiconductor nonvolatile memory device of the present invention has a field effect type memory transistor having a charge storing layer between the control gate and the channel formation region in the semiconductor layer.

The charge storing layer has the function of holding a charge. When a charge is stored in the charge storing layer, an electric field is generated due to the stored charge and therefore the threshold voltage of the memory transistor changes. The storage of data becomes possible by this change.

In the above semiconductor nonvolatile memory device of the present invention, as a low price and high precision transistor, a TFT is formed having a charge storing layer between the control gate and the channel formation region in the semiconductor layer on a silicon substrate coated on its surface with a silicon oxide film. As the silicon substrate coated on its surface with a silicon oxide film, since the channel formation region is not formed in the silicon substrate, a silicon substrate of a low quality having a price of ½ to ⅓ that of the usual MOS LSI use silicon substrate can be used. Accordingly, a semiconductor nonvolatile memory device using a TFT as a memory transistor can use the above cheap substrate to realize a great reduction of costs.

Further, the TFT formed on the insulating substrate comprised of the silicon substrate coated on its surface with a silicon oxide film can make the junction capacity of the transistor substantially zero and further is a full depletion type, therefore the depletion layer capacitance is negligibly small—which is advantageous in the point of the read speed (ON bit sensing). Further, the gate swing value is determined by only a trap density in the semiconductor layer, a sharp inversion characteristic is obtained, and it is possible to obtain a memory transistor which can reduce the erase voltage and other voltages and operate at a high speed.

The semiconductor nonvolatile memory device of the present invention described above preferably has a peripheral circuit transistor on the substrate, and more preferably a gate width of the gate of the peripheral circuit transistor is larger than a gate length of the gate and an average particle size of the polycrystalline silicon or quasi single crystal silicon forming the semiconductor layer. The peripheral circuit transistor can also be formed on the same substrate and can be made a TFT structure. By this, it becomes possible to form miniature circuits on the substrate at low cost. For example, by forming CMOS and other logical gates of TFTs on the same substrate, a variety of multi-functional microsystems can be realized on a chip. In this case, by making the gate width of the peripheral circuit transistors larger than the gate length and the average particle size of the polycrystalline silicon or quasi monocrystal forming the semiconductor layer, it is possible to improve the characteristics of the peripheral circuit transistors and improve the uniformity of characteristics. When the peripheral circuit transistors are formed by CMOS, they can be easily formed under the fine rule.

Further, to attain the above object, the semiconductor nonvolatile memory device of the present invention is a semiconductor nonvolatile memory device in which memory transistors having charge storing layers are connected, formed with a plurality of thin film transistors, each transistor comprising a semiconductor layer formed by polycrystalline silicon having a channel formation region formed in an insulating substrate of a silicon substrate coated on its surface with a silicon oxide film, a charge storing layer formed in the semiconductor layer, a control gate formed at an upper layer of the charge storing layer, and source and drain regions formed in the semiconductor layer and connected to the channel formation region and each thin film transistor acting as a memory transistor, the substrate comprising a peripheral circuit transistor, the gate width of the gate of the peripheral circuit transistor being larger than the gate length of the gate and the average particle size of the polycrystalline silicon forming the semiconductor layer.

In the semiconductor nonvolatile memory device of the present invention described above, as the silicon substrate coated on its surface with a silicon oxide film, since the channel formation region is not formed in the silicon substrate, a low quality, cheap substrate can be used and therefore a great reduction of cost can be realized. Further, the junction capacity of the transistor can be made substantially zero, since it is a full depletion type, the depletion layer capacitance is negligibly small, the gate swing value is determined by only the trap density in the semiconductor layer, a sharp inversion characteristic is obtained, and a memory transistor which can lower the erase voltage and other voltages and can operate at a high speed can be obtained. Further, since the semiconductor nonvolatile memory device of the present invention described above has peripheral circuit transistors on the substrate and the gate widths of the gates of the peripheral circuit transistors are larger than the gate lengths of the gates and the average particle size of the polycrystalline silicon forming the semiconductor layer, it becomes possible to form miniature circuits, for example, CMOS or other logical gates of TFTs on the substrate at low cost by peripheral circuit transistors having excellent characteristics and good uniformity in characteristics and therefore a variety of multifunctional microsystems can be formed on a chip.

In the semiconductor nonvolatile memory device of the present invention described above, preferably the charge storing layer is a floating gate made of a conductor insulated by an insulating film. It becomes possible to seal a charge in the conductor insulated by the insulating film and obtain a floating gate and thereby obtain a floating gate type semiconductor nonvolatile memory device.

In the semiconductor nonvolatile memory device of the present invention described above, alternatively preferably the charge storing layer is an insulator having charge traps, more preferably the insulator having charge traps is a oxide-nitride-oxide stacked insulating film or a nitride-oxide stacked insulating film. Alternatively, the insulator having charge traps is an insulator holding internally nanocrystals comprised of conductors having an average particle size of 2 to 5 nm. The insulator having charge traps can hold a charge in its film, for example, may be made a MONOS structure having an ONO film (oxide-nitride-oxide stacked insulating film) or a MNOS structure having a NO film (nitride-oxide stacked insulating film) or a nanodot memory which can hold a charge in nanocrystals in the insulating film.

In the semiconductor nonvolatile memory device of the present invention described above, preferably the memory transistors are connected in a NOR type array. By this, it is possible to obtain a NOR type semiconductor nonvolatile memory device capable of performing high speed random access reading and capable of performing batch erasing for every erasing sector.

In the semiconductor nonvolatile memory device of the present invention described above, alternatively preferably the memory transistors are connected in a NAND type array. More preferably, each of the memory transistors comprises a lower gate insulating film formed at a lower layer of the semiconductor layer and an erase gate formed at a lower layer of the lower gate insulating film. Still more preferably, the erase gate is formed connected to at least the erase gate of an adjoining memory transistor. By this, it is possible to obtain a NAND type semiconductor nonvolatile memory device which is advantageous in the points of an increased degree of integration, increased capacity, and lowered cost. By providing the erase gate at a lower layer of the semiconductor layer via the lower gate insulating film and supplying an erase voltage (for example, positive voltage) to the erase gate, it becomes possible to erase the data. By adopting a structure in which this erase gate is connected to the erase gate of the adjoining memory transistor and therefore the gates are shared by the entire memory cell array or in units of blocks, batch erasing of the entire memory array or for every erasing sector in units of blocks is possible.

Further, to attain the above object, a method of production of a semiconductor nonvolatile memory device of the present invention is a method of production of a semiconductor nonvolatile memory device in which memory transistors having charge storing layers are connected, comprising forming a thin film transistor acting as a memory transistor by a step of forming a semiconductor layer having a channel formation region on an insulating substrate of glass or plastic; a step of forming a charge storing layer at an upper layer of the semiconductor layer; a step of forming a control gate at an upper layer of the charge storing layer; and a step of forming source and drain regions connected to the channel formation region.

The method of production of the semiconductor nonvolatile memory device of the present invention described above is one forming a semiconductor layer having a channel formation region on an insulating substrate made of glass or plastic, forming a charge storing layer at an upper layer of the semiconductor layer, forming a control gate at an upper layer of the charge storing layer, and forming source and drain regions connected to the channel formation region. By this, a thin film transistor (TFT) acting as a memory transistor having a charge storing layer can be formed between the control gate and the channel formation region in the semiconductor layer on a low price insulating substrate made of glass or plastic.

According to the method of production of the semiconductor nonvolatile memory device of the present invention described above, since the TFT acting as the memory transistor having the charge storing layer is formed on a low price insulating substrate such as glass, it is possible to produce a semiconductor nonvolatile memory device having memory transistors capable of lowering the erase voltage and other voltages and capable of operating at a high speed with a great reduction of cost.

In the method of production of a semiconductor nonvolatile memory device of the present invention described above, preferably the steps from the step of forming the semiconductor layer are performed at not more than 600° C. By this, it is possible to use an insulating substrate made of glass or plastic which is low in cost but has a low melting point and possible to reduce the cost.

In the method of production of a semiconductor nonvolatile memory device of the present invention described above, preferably the step of forming the semiconductor layer includes a step of forming a silicon layer and a step of crystallizing the silicon layer by exciter laser annealing or a low temperature solid phase crystallization. By this, as the layer serving as the channel formation region of TFT, it is possible to form a high performance semiconductor layer, i.e., a polycrystalline silicon layer or a quasi single crystal silicon layer, capable of reducing the trap density in the film and reducing the gate swing value by a low temperature process suited for formation on a glass substrate or plastic substrate.

In the method of production of a semiconductor nonvolatile memory device of the present invention described above, more preferably the step of forming the silicon layer is a step of formation by a CVD (chemical vapor deposition) method using $Si_2H_6$ or $SiH_4$ as a starting material. As the CVD process, a low pressure CVD process or a plasma CVD process can be preferably used. According to the low pressure CVD process or the plasma CVD process or other CVD process using $Si_2H_6$ or $SiH_4$ as the starting material, the silicon layer can be formed under conditions with little intake of hydrogen into the film—which becomes a cause of scattering of the insulating film and formation of holes in a low temperature process of 500° C. or less when firing a laser beam in the later ELA step or the like.

In the method of production of a semiconductor nonvolatile memory device of the present invention described above, alternatively preferably the step of forming the silicon layer is a step of formation by a sputtering process. According to the sputtering process, the silicon layer can be formed by a low temperature process of 500° C. or less.

In the method of production of a semiconductor nonvolatile memory device of the present invention described above, alternatively preferably the step of forming the charge storing layer includes a step of forming a gate insulating film at an upper layer of the semiconductor layer; a step of forming a floating gate comprised of a conductor at an upper layer of the gate insulating film; and a step of forming an inter-layer insulating film at an upper layer of the floating gate. By this, it is possible to obtain a floating gate type semiconductor nonvolatile memory device which seals and holds a charge in the conductive floating gate by the gate insulating film and the inter-layer insulating film.

In the method of production of a semiconductor nonvolatile memory device of the present invention described above, more preferably the step of forming the charge storing layer is a step of forming an insulator having charge traps at an upper layer of the semiconductor layer. By this, it is possible to produce a semiconductor nonvolatile memory device which stores a charge in an insulator having charge traps, for example, of a MONOS structure having an ONO film (oxide-nitride-oxide stacked insulating film) or a MNOS structure having a NO film (nitride-oxide stacked insulating film).

In the method of production of a semiconductor nonvolatile memory device of the present invention described above, more preferably the memory transistors are formed connected in a NOR type array. By this, it is possible to produce a NOR type semiconductor nonvolatile memory device capable of performing high speed random access reading and capable of performing batch erasing for every sector.

In the method of production of a semiconductor nonvolatile memory device of the present invention described above, alternatively preferably the memory transistors are formed connected in a NAND type array. It is therefore possible to produce a NAND type semiconductor nonvolatile memory device which is advantageous in the points of the increased degree of integration, increased capacity, and lowered cost.

In the method of production of a semiconductor nonvolatile memory device of the present invention described above, more preferably has further, before the step of forming the semiconductor layer, a step of forming an erase gate on the insulating substrate and a step of forming a lower gate insulating film on the erase gate. By this, it is possible to produce a semiconductor nonvolatile memory device capable of erasing data by supplying an erase voltage (for example positive voltage) to an erase gate and capable of batch erasing the entire memory array or for every erasing sector in units of blocks by sharing of erase gates by the entire memory array or in units of blocks.

Further, to attain the above object, the method of production of a semiconductor nonvolatile memory device of the present invention is a method of production of a semiconductor nonvolatile memory device comprising a first transistor acting as a memory transistor having a charge storing layer and a second transistor for a peripheral circuit, comprising: a step of forming a first semiconductor layer having a first channel formation region for the first transistor in a first transistor forming region and forming a second semiconductor layer having a second channel formation region for the second transistor in a second transistor forming region on an insulating substrate of a silicon substrate coated on its surface with a silicon oxide film or on an insulating substrate of glass or plastic; a step of forming a charge storing layer at an upper layer of the first semiconductor layer and forming a gate insulating film at an upper layer of the second semiconductor layer; a step of forming a control gate at an upper layer of the charge storing layer and forming a gate electrode at an upper layer of the gate insulating film; and a step of forming first source and drain regions connected to a first channel formation region and second source and drain regions connected to a second channel formation region.

According to the method of production of a semiconductor nonvolatile memory device of the present invention described above, the memory transistors of the TFT structure and the peripheral circuit transistors can be simultaneously formed on the same substrate and it becomes possible to produce a variety of multifunctional Microsystems on a chip by forming CMOS and other logical gates of the TFTs on the same substrate. Since the TFTs acting as the memory transistors having the charge storing layers are formed on a low price insulating substrate such as glass, it is possible to produce a semiconductor nonvolatile memory device having memory transistors capable of lowering the erase voltage and other voltages and capable of operating at a high speed with a great reduction of cost. When a silicon substrate coated on its surface with a silicon oxide film is used as the substrate, it becomes possible to use a high temperature process such as a thermal oxidation process in the step of forming the gate insulating film or tunnel insulating film and therefore it is possible to form a high quality gate insulating film or tunnel insulating film.

Further, to attain the above object, the method of production of a semiconductor nonvolatile memory device of the present invention is a method of production of a semiconductor nonvolatile memory device comprising a first transistor having a charge storing layer and a second transistor for a peripheral circuit, comprising: a step of forming an erase gate in a first transistor forming region on an insulating substrate of a silicon substrate coated on its surface with a silicon oxide film or on an insulating substrate of glass or plastic; a step of forming a lower gate insulating film at an upper layer of the erase gate; a step of forming a first semiconductor layer having a first channel formation region for the first transistor at an upper layer of the lower gate insulating film and forming a second semiconductor layer having a second channel formation region for the second transistor in a second transistor forming region on the substrate; a step of forming a charge storing layer at an upper layer of the first semiconductor layer and forming a gate insulating film at an upper layer of the second semiconductor layer; a step of forming a control gate at an upper layer of the charge storing layer and forming a gate electrode at an upper layer of the gate insulating film; and a step of forming first source and drain regions connected to the first channel formation region and second source and drain regions connected to the second channel formation region.

According to the method of production of the semiconductor nonvolatile memory device of the present invention described above, the memory transistors of the TFT structure and the peripheral circuit transistors can be simultaneously formed on the same substrate and it is possible to form memory transistors of a structure having erase gates. Due to this, it is possible to produce a semiconductor nonvolatile memory device having a erase gate structure shared by the entire memory array or in units of blocks—which was difficult in a NAND type TFT memory transistor—and is capable of performing batch erasing of the entire memory array or for every erasing sector in units of blocks. Since the TFT acting as the memory transistor having the charge storing layer is formed on a low price insulating substrate such as glass, it is possible to produce a semiconductor nonvolatile memory device having a memory transistor capable of lowering the erase voltage and other voltages and capable of operating at a high speed with the great reduction of costs. When using a silicon substrate coated on its surface with a silicon oxide film as the substrate, it becomes possible to use a high temperature process such as a thermal oxidation process in the step of formation of the gate insulating film or tunnel insulating film and it is possible to form a high quality gate insulating film or tunnel insulating film.

BRIEF DESCRIPTION OF THE DRAWINGS

These and other objects and features of the present invention will become clearer from the following description of the preferred embodiments given with reference to the related drawings, in which:

FIGS. 4A to 4C are sectional views of the steps of a method of production of the semiconductor nonvolatile memory device according to the first embodiment, in which FIG. 4A shows the steps up to formation of an underlying insulating film; FIG. 4B shows the steps up to depositing a silicon semiconductor layer; and FIG. 4C shows the steps up to crystallization of the silicon semiconductor layer;

FIG. 5D to FIG. 5F are sectional views showing the steps after FIG. 4C, in which FIG. 5D shows the steps up to element isolation of the semiconductor layer; FIG. 5E shows the steps up to the formation of a tunnel insulating film; and FIG. 5F shows the steps up to the formation of a floating gate layer;

FIG. 6G to FIG. 6I are sectional views showing the steps after FIG. 5F, in which FIG. 6G shows the steps up to removal of the floating gate layer of a peripheral circuit transistor forming region; FIG. 6H shows the steps up to the formation of an inter-layer insulating film; and FIG. 6I shows the steps up to the formation of a control gate layer;

FIG. 7J to FIG. 7K are sectional views showing the steps after FIG. 6I, in which FIG. 7J shows the steps up to the formation of a resist film of a control gate pattern of a memory transistor and a gate electrode pattern of the peripheral circuit transistor; and FIG. 7K shows the steps up to patterning of a control gate of the memory transistor and a gate electrode of the peripheral circuit transistor;

FIG. 12A to FIG. 12C are sectional views of the steps of a method of production of the semiconductor nonvolatile memory device according to the fourth embodiment, in which FIG. 12A shows the steps up to the formation of a lower gate insulating film; FIG. 12B shows the steps up to deposition of the silicon semiconductor layer; and FIG. 12C shows the steps up to crystallization of the silicon semiconductor layer;

FIG. 13D to FIG. 13F are sectional views showing the steps after FIG. 12C, in which FIG. 13D shows the steps up to the element isolation of the semiconductor layer; FIG. 13E shows the steps up to the formation of the tunnel insulating film; and FIG. 13F shows the steps up to the formation of the control gate layer;

DESCRIPTION OF THE PREFERRED EMBODIMENTS

Figure 1:
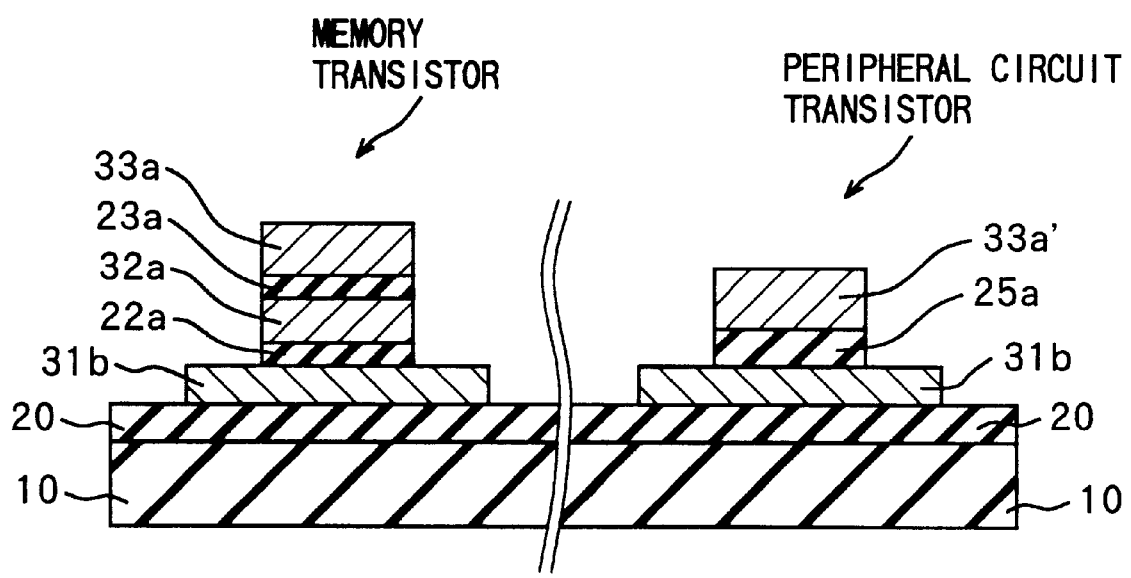
FIG. 1 is a sectional view of a semiconductor nonvolatile memory device according to a first embodiment of the present invention.

Below, an explanation will be made of embodiments of the semiconductor nonvolatile memory device of the present invention and the method of production of the same by referring to the drawings.

First Embodiment

FIG. 1 is a sectional view of a semiconductor nonvolatile memory device of the present embodiment. The memory transistor is formed in a region on the left side of the figure. For example, an underlying insulating film 20 made of for example silicon nitride or silicon oxide is formed at an upper layer of an insulating substrate 10 made of a glass substrate such as nonalkali glass or a plastic substrate. A semiconductor layer 31*b* made of for example a polycrystalline silicon and having a channel formation region is formed at an upper layer thereof.

A tunnel insulating film 22*a* of a thin film made of for example silicon oxide is formed at the upper layer of the semiconductor layer 31b. A floating gate 32a made of for example polycrystalline silicon is formed at the upper layer thereof, an inter-layer insulating film 23a made of for example an ONO film (oxide-nitride-oxide stacked film) or silicon oxide film is formed at the upper layer thereof, and a control gate 33a made of for example polycrystalline silicon is formed at the upper layer thereof. Further, in the semiconductor layer 31b, not illustrated source and drain diffusion layers connected to the channel formation region are formed. By this, a field effect transistor of TFT structure is formed which is having a floating gate 32a insulated by the insulating film between the control gate 33a and the channel formation region in the semiconductor layer 31b.

In the field effect transistor having the above structure, the floating gate 32a has the function of holding a charge in the film, while the tunnel insulating film 22a and the inter-layer insulating film 23a have the role of sealing the charge in the floating gate 32a. By supplying an appropriate voltage to the control gate 33a and the not illustrated source and drain diffusion layers in the semiconductor layer 31b, a Fowler Nordheim type tunnel current is produced, electrons are injected from the semiconductor layer 31b into the floating gate 32a through the tunnel insulating film 22a, or electrons are released from the floating gate 32a to the semiconductor layer 31b. When storing a charge in the floating gate 32a, an electric field is generated due to the stored charge, therefore the threshold voltage of the transistor changes, so the transistor becomes a memory transistor with which storage of data becomes possible. For example, data can be erased by storing a charge in the floating gate 32a, and data can be written by releasing the charge stored in the floating gate 32a.

On the other hand, a peripheral circuit transistor is formed in the region at the right side of the figure. An underlying insulating film 20 made of for example silicon nitride or silicon oxide is formed at the upper layer of the substrate 10 on which the memory transistor is formed, and a semiconductor layer 31b made of for example polycrystalline silicon and having a channel formation region is formed at the upper layer thereof. At the upper layer of the semiconductor layer 31b, a thin gate insulating film 25a made of for example a stacked insulating film of silicon oxide and an ONO film or a silicon oxide film is formed. A gate electrode 33a' made of for example polycrystalline silicon is formed at the upper layer thereof. Further, not illustrated source and drain diffusion layers connected to the channel formation region are formed in the semiconductor layer 31b. This gives a field effect transistor of the TFT structure.

The semiconductor nonvolatile memory device described above can realize a great reduction of costs by using a low price substrate such as a glass substrate. Further, the TFT formed on an insulating substrate such as a glass substrate can make the junction capacity of the transistor substantially zero, has a negligibly small depletion layer capacitance since it is a full depletion type, has a gate swing value determined by only the trap density in the semiconductor layer, gives a sharp inversion characteristic, and can form a transistor which can lower the erase voltage and other voltages and can operate at a high speed. Particularly, by forming the semiconductor layer 31b by polycrystalline silicon or quasi single crystal silicon, the trap density in the semiconductor layer can be reduced, the gate swing value is reduced, and thus a further reduction of the erase voltage and other voltages is possible.

Further, in the semiconductor nonvolatile memory device described above, since the peripheral circuit transistors are formed on the same substrate, so it becomes possible to form miniature circuits on the substrate at a low cost. By forming CMOS and other logical gates etc. of the TFTs on the same substrate, a variety of multi-functional Microsystems can be realized on a chip.

Figure 2A:
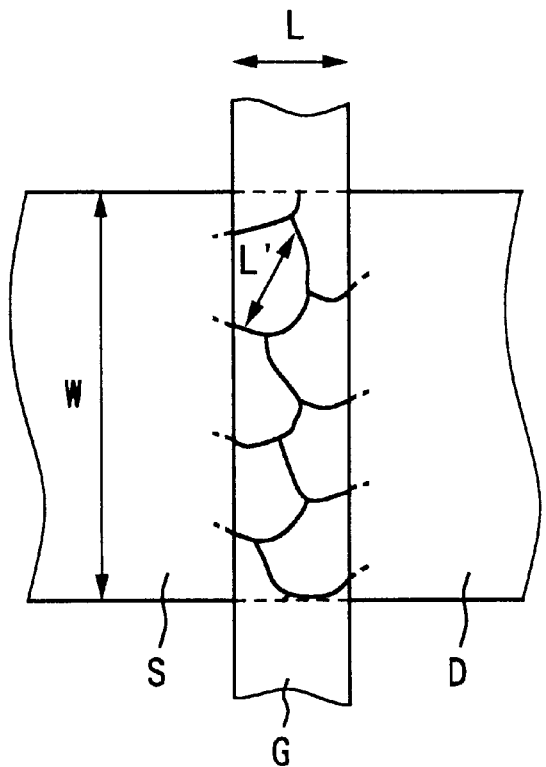
FIG. 2, consisting of FIGS. 2A through 2B, is a view showing a relationship of a gate width and a gate length of a peripheral circuit transistor of the semiconductor nonvolatile memory device according to the first embodiment and an average particle size of polycrystalline silicon for forming a semiconductor layer.
Figure 2B:
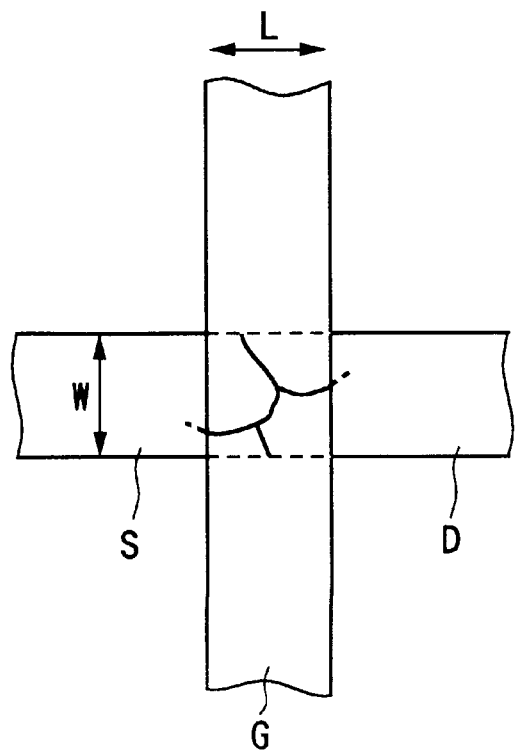

The gate electrode of the peripheral circuit transistor is formed by for example polycrystalline silicon. As shown in FIG. 2A, its gate length W is formed larger than the gate length L and an average particle size L' of the polycrystalline silicon or quasi single crystal silicon forming the semiconductor layer. By this, the characteristics of the peripheral circuit transistor are improved and the uniformity of characteristics can be enhanced. When forming the peripheral circuit transistor by CMOS, it can be easily formed under the fine rule. FIG. 2B shows a case where the gate width W is smaller than that of FIG. 2A and is the same degree as the gate length L and the average particle size L' of the polycrystalline silicon or quasi single crystal silicon forming the semiconductor layer. The characteristics of the peripheral circuit transistors and the uniformity thereof are not good.

Figure 3A:
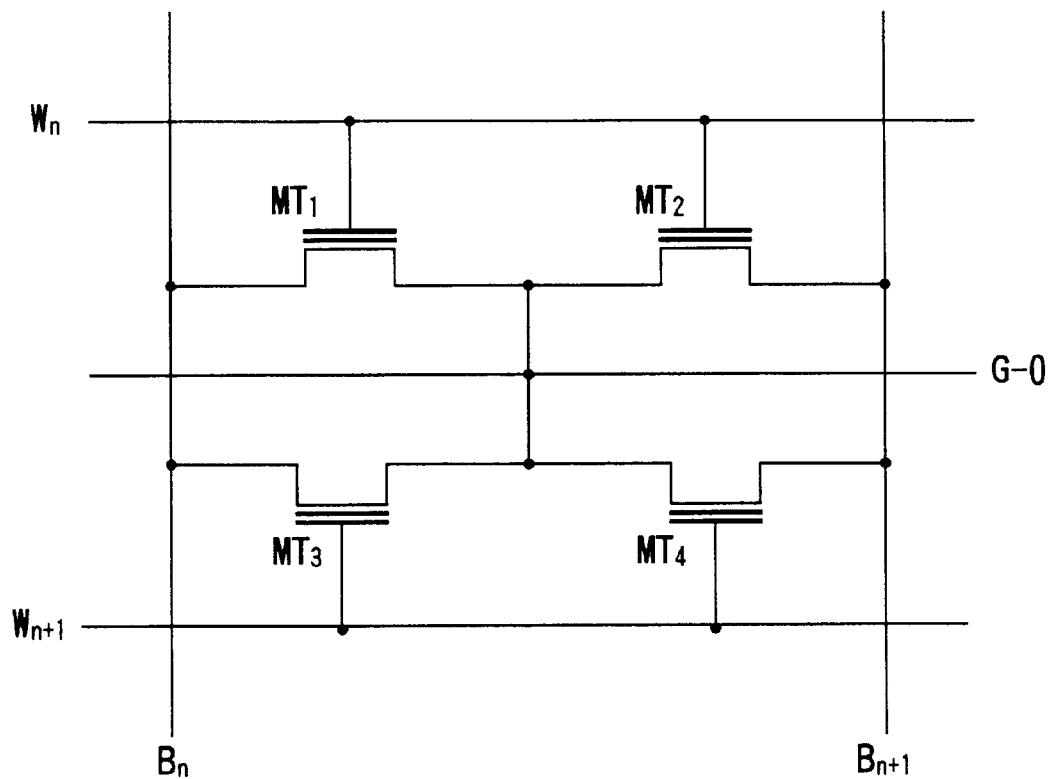
FIG. 3A is an equivalent circuit diagram of a NOR type semiconductor nonvolatile memory device according to the first invention.

FIG. 3A is an equivalent circuit diagram of a semiconductor nonvolatile memory device in which memory transistors having the structure shown in FIG. 1 are connected in a NOR type array. Control gates of two memory transistors $MT_1$ and $MT_2$ are connected to the n-th word line $W_n$, and sources are opened to the ground (G-O) or given a source voltage. Further, drains are respectively connected to the n-th bit line $B_n$ and the (n+1)th bit line $B_{n+1}$. Further, another two memory transistors $MT_3$ and $MT_4$ are similarly connected to the word line and bit lines.

Figure 3B:
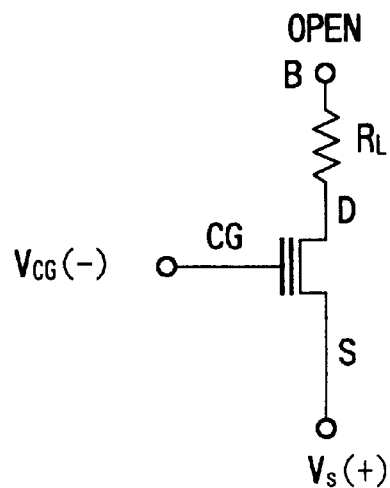
FIG. 3B is an equivalent circuit diagram for explaining an erase operation.

As the method of erasing data in the NOR type semiconductor nonvolatile memory device described above, as shown in FIG. 3B, a low voltage Vcg is supplied to the control gate CG, a high voltage $V_s$ is supplied to the source S, and the bit line B is made open. In this way, by the Fowler Nordheim type tunnel phenomenon, data can be erased by the source erase operation of draining electrons in the floating gate. Since the array is the NOR type, batch erasing of the entire memory array or for every erasing sector can be carried out.

Figure 4A:
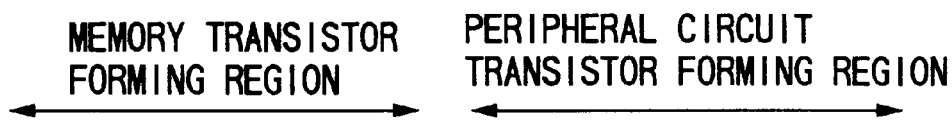
Figure 4A:
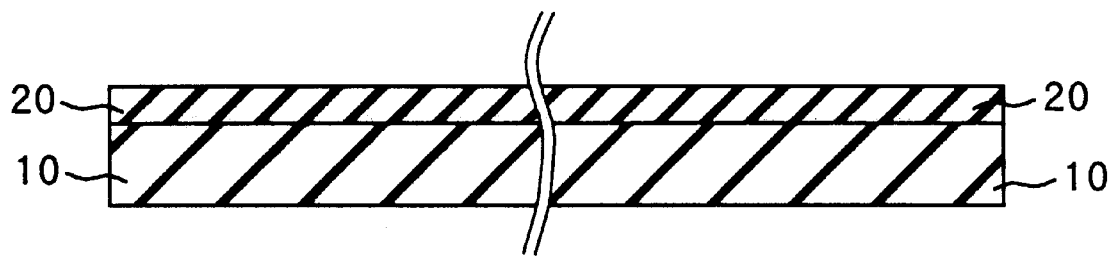

Next, an explanation will be made of the method of production of the semiconductor nonvolatile memory device of the present embodiment. First, as shown in FIG. 4A, an insulating substrate 10 made of a glass substrate such as nonalkali glass or of a plastic substrate is used. When using a substrate having low melting point such as a glass substrate, the following steps are performed with the process temperature made not more than 600° C. For example, the insulating film is formed by the sputtering process or a chemical vapor deposition (hereinafter referred to as a "CVD") process. Silicon oxide, silicon nitride, or the like is deposited to a thickness of for example 200 nm in the case of silicon nitride or 400 nm in the case of silicon oxide on this insulating substrate 10 by for example a plasma enhanced CVD process or a sputtering process to form the underlying insulating film 20.

Figure 4B:
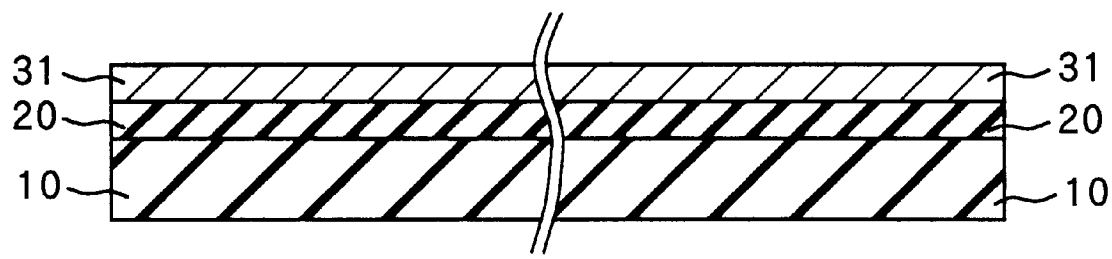

Next, as shown in FIG. 4B, amorphous silicon is deposited at a thickness of 40 nm at the upper layer of the underlying insulating film 20 by for example a sputtering process or CVD process to form the semiconductor layer 31. Particularly, the sputtering process or a low pressure CVD process is preferable since the intake of hydrogen into the film, which becomes a cause of scattering of the insulating film and opening of holes, when firing the laser beam in the later ELA step or the like, becomes small. Further, according to the low pressure CVD process using $SiH_4$ or $Si_2H_6$ as the starting material, the silicon layer can be formed in a low temperature process of 500° C. or less.

Figure 4C:
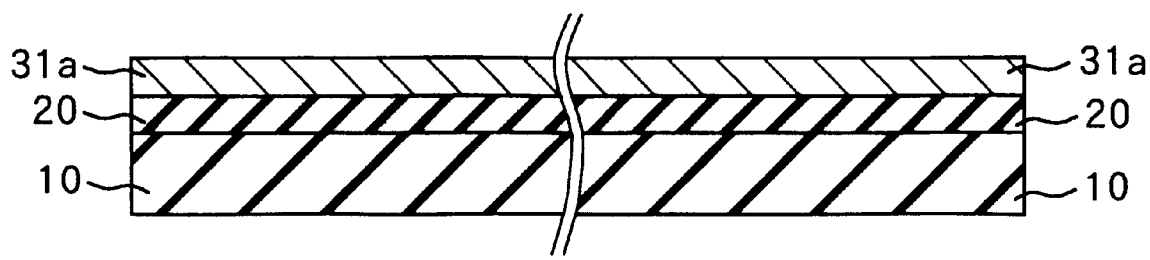

Next, as shown in FIG. 4C, the semiconductor layer 31 of amorphous silicon is crystallized by for example ELA processing to obtain a semiconductor layer 31a of polycrystalline silicon. As the ELA processing, various beam shot processes can be considered, but in a top gate TFT, the flatness, smoothness, and uniformity of the silicon film are considered important and a single shot or multishots for the chip as a whole is preferred. Further, crystallization may be carried out by heating the substrate to improve the crystallinity. For example, step-and-repeat ELA processing is for example performed by five shots of a uniform 2×2 cm$^2$ exciter laser beam at 400° C. with an energy of 300 mJ/cm$^2$. Further, it is also possible to perform this crystallization by a low temperature solid phase crystallization process (SPC) or ELA processing after the SPC processing.

Figure 5D:
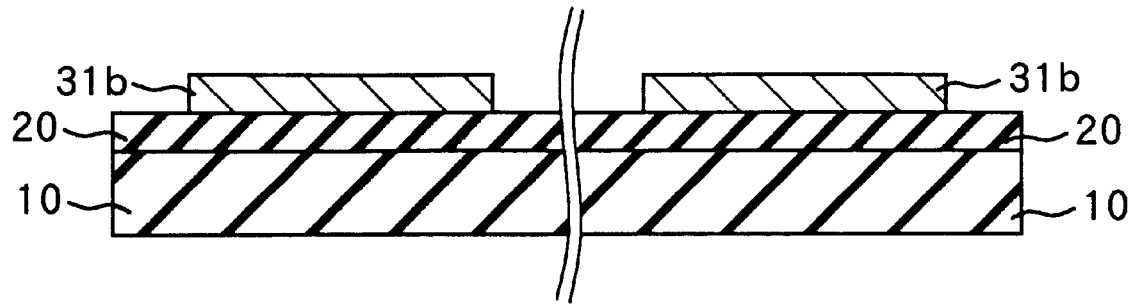

Next, as shown in FIG. 5D, a resist film is patterned and the semiconductor layer 31a is patterned by a photolithography processing to form the semiconductor layer 31b with elements isolated in the form of islands. Due to the TFT structure, in comparison with an element isolation process such as a LOCOS process usually used in a semiconductor device of the related art formed on a silicon wafer, the elements can be easily isolated.

Figure 5E:
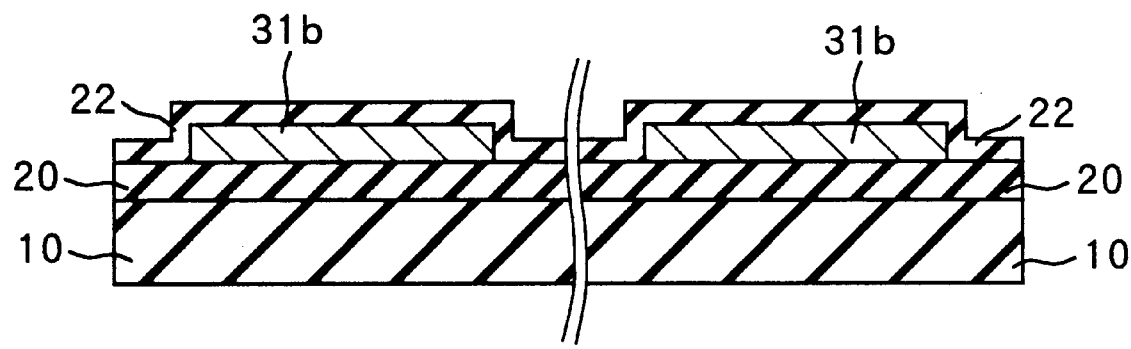

Next, as shown in FIG. 5E. silicon oxide is deposited to a thickness of about 9 nm by for example a plasma CVD process to form the tunnel insulating film 22. As the tunnel insulating film 22, a particularly high quality film is required, so in order to form this by a low temperature process, preferably it is formed by an ECR (electron cyclotron resonance) type plasma CVD process.

Figure 5F:
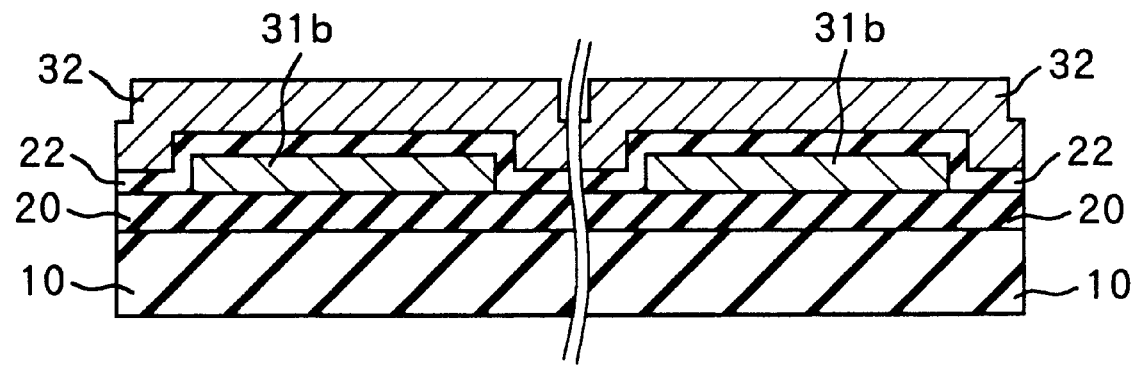

Next, as shown in FIG. 5F, polycrystalline silicon containing a conductive impurity is deposited at the upper layer of the tunnel insulating film 22 by for example a CVD process to form a floating gate layer 32. Alternatively, it is possible to deposit the polycrystalline silicon, then implant ions of the conductive impurity.

Figure 6G:
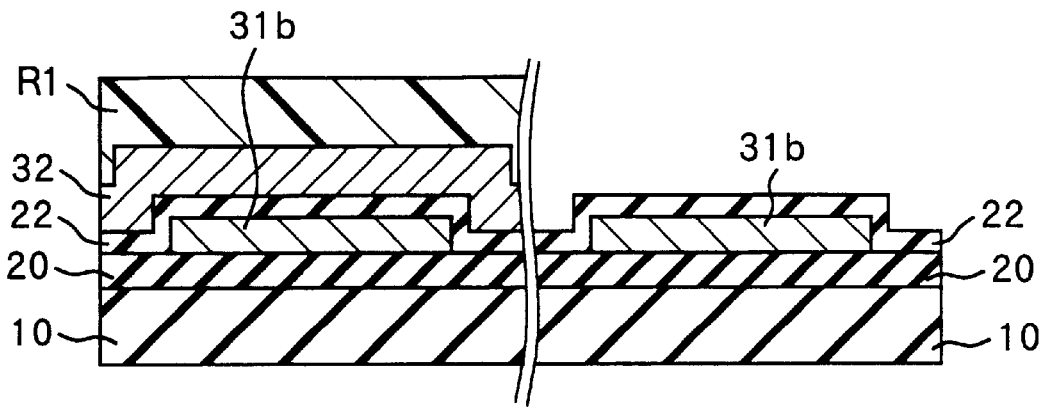

Next, as shown in FIG. 6G, a resist film R1 for protecting the memory transistor forming region is patterned by a photolithography step and etched by RIE (reactive ion etching) etc. to remove the floating gate layer 32 deposited at the peripheral circuit transistor forming region.

Figure 6H:
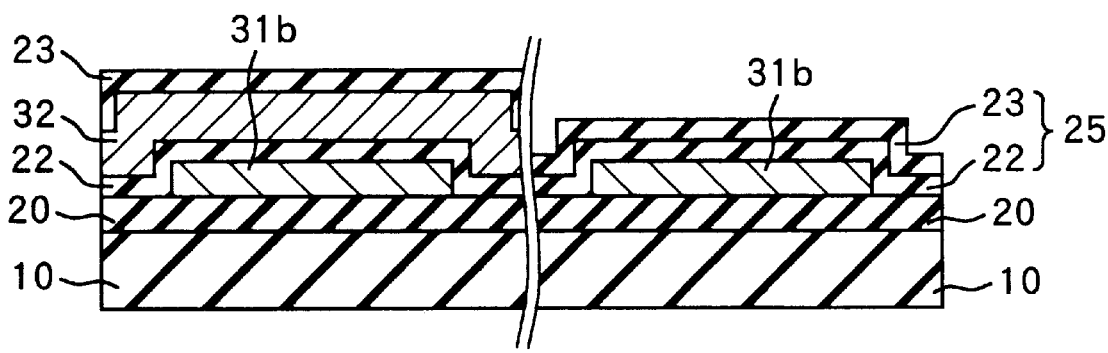

Next, as shown in FIG. 6H, after removing the resist film R1, for example an ONO film (oxide-nitride-oxide stacked insulating film) or silicon oxide film is deposited on the entire surface coating the floating gate layer 32 by for example a CVD process to form an inter-layer insulating film 23. At this time, in the peripheral circuit transistor forming region the tunnel insulating film 22 and the inter-layer insulating film 23 are stacked and become a gate insulating film 25 of the peripheral circuit transistor.

Figure 6I:
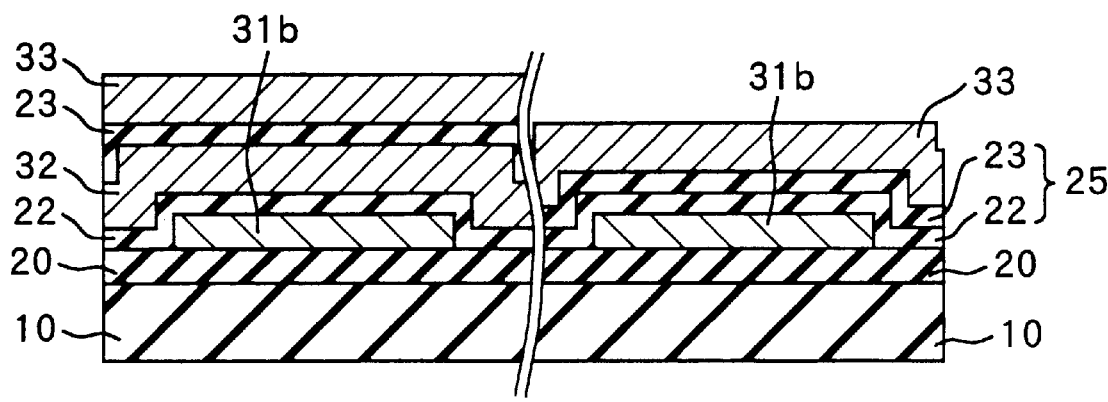

Next, as shown in FIG. 6I, polycrystalline silicon is deposited at the upper layer of the inter-layer insulating film 23 by for example a CVD process to form the control gate layer 33.

Figure 7J:
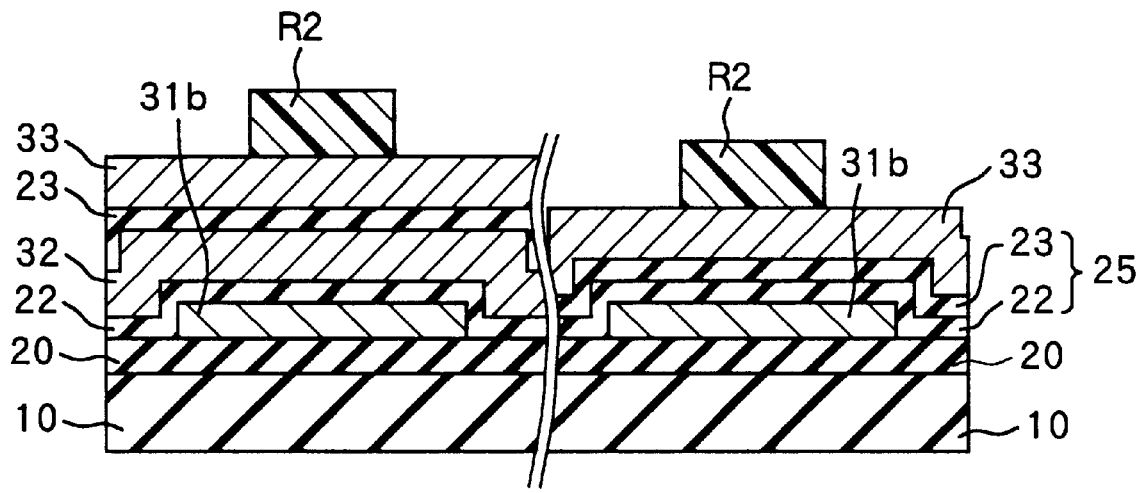

Next, as shown in FIG. 7J, a resist film R2 having a pattern of the control gate of the memory transistor and the gate electrode of the peripheral circuit transistor is patterned by a photolithography process.

Figure 7K:
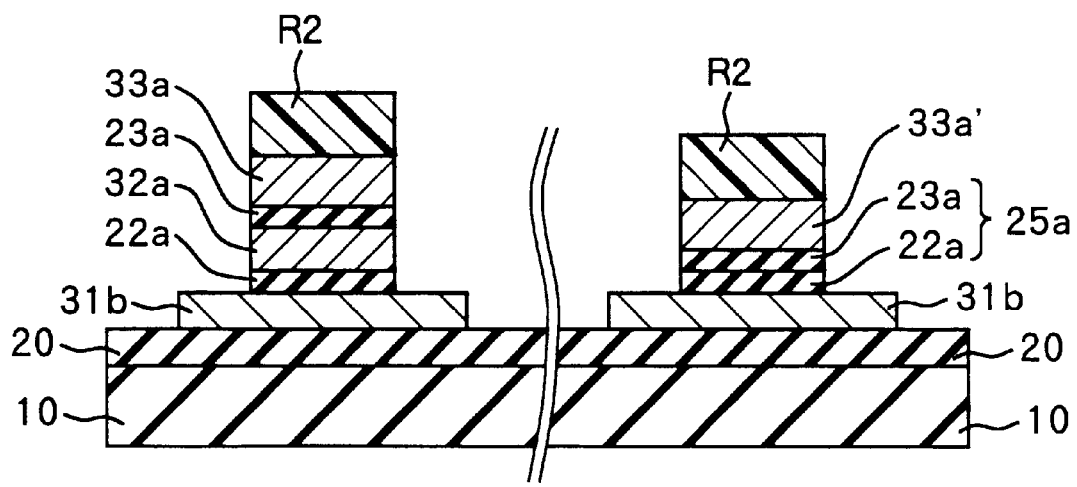

Next, as shown in FIG. 7K, etching such as RIE is applied by using the resist film R2 as a mask so as to pattern in a self-alignment manner a control gate 33a, an inter-layer insulating film 23a, a floating gate 32a, and a tunnel insulating film 22a in the memory transistor forming region. Simultaneously, this patterns a gate electrode 33a' and a gate insulating film 25a in a self-alignment manner in the peripheral circuit transistor forming region.

Next, the resist film R2 is removed, then, using the control gate 33a and the gate electrode 33a' as a mask, for example P ions are implanted at a dosage of for example 2×10$^{15}$ ions/cm$^2$ in the source and drain diffusion layer forming region to form the not illustrated source and drain diffusion layers. Further, annealing is carried out by the ELA process or an RTA (rapid thermal annealing) process under conditions where the glass is not melted, for example, by line-like scanning to activate the impurity ions of the source and drain diffusion layers. By the above, the device shown in FIG. 1 can be formed. As the steps after this, an inter-layer insulating film is formed coating the control gate 33a, contacts etc. are opened, and bit lines and other upper layer interconnections are formed to obtain the desired semiconductor nonvolatile memory device.

According to the semiconductor nonvolatile memory device of the present embodiment, since the TFT acting as the memory transistor having the charge storing layer is formed on a low price insulating substrate such as glass, it is possible to realize a semiconductor nonvolatile memory device capable of lowering erase voltage and other voltages and capable of operating at a high speed with a greatly reduced cost. Since the peripheral circuit transistors are simultaneously formed on the same substrate, it is possible to form CMOS and other logical gates of the TFTs on the same substrate and it becomes possible to form a variety of multifunctional microsystems on a chip.

In the above present embodiment, it is also possible to use a silicon substrate coated on its surface with a silicon oxide film as the substrate. In this case, since the channel formation region is not formed in the silicon substrate, a silicon substrate having a low quality and having a price of ½ to ⅓ of the usual MOS LSI use silicon substrate can be used and accordingly the great reduction of cost can be realized. Further, since a high temperature process such as a thermal oxidation process can be adopted, it becomes possible to form a high quality gate insulating film and tunnel insulating film.

Second Embodiment

Figure 8:
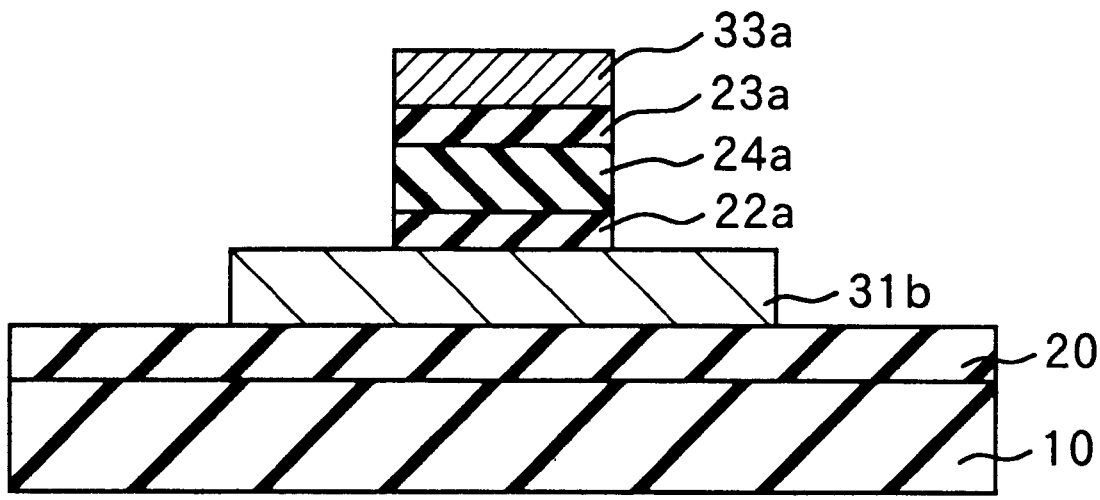
FIG. 8 is a sectional view of the semiconductor nonvolatile memory device according to a second embodiment of the present invention.

FIG. 8 is a sectional view of a semiconductor nonvolatile memory device of the present embodiment. An underlying insulating film 20 made of for example silicon nitride or silicon oxide is formed at an upper layer of for example an insulating substrate 10 made of a glass substrate such as nonalkali glass or of a plastic substrate. A semiconductor layer 31b made of for example polycrystalline silicon or quasi single crystal silicon and having the channel formation region is formed at the upper layer thereof. A tunnel insulating film (bottom insulating film) 22a of a thin film made of for example silicon oxide is formed at the upper layer of the semiconductor layer 31b, charge traps insulating film 24a made of for example silicon nitride is formed at the upper layer thereof, and a top insulating film 23a made of for example silicon oxide is formed at the upper layer thereof. The bottom insulating film 22a, charge trap insulating film 24a, and top insulating film 23a form a stacked insulating film having a charge storage capability due to charge trap levels in the film. A control gate 33a made of for example polycrystalline silicon is formed at the upper layer of the top insulating film 23a. Further, not illustrated source and drain diffusion layers connected to the channel formation region are formed in the semiconductor layer 31b. By this, a memory transistor of a MONOS structure having a charge storing layer comprised of an ON film is obtained, which is a field effect transistor having a stacked insulating film having a charge storage capability between the control gate 33a and the channel formation region in the semiconductor layer 31b.

In the field effect transistor of the above structure, the stacked insulating film comprising the bottom insulating film 22a, charge trap insulating film 24a, and top insulating film 23a has a function of holding a charge in the film. By supplying an appropriate voltage to the control gate 33a and the not illustrated source and drain diffusion layers in the semiconductor layer 31b, a Fowler Nordheim type tunnel current is produced, and a charge injected through the bottom insulating film 22a from the semiconductor layer 31b is trapped by the charge trap levels in the charge trap insulating film 24a or the charge trap levels at the interface between the charge trap insulating film 24a and the top insulating film 23a. Alternatively, a charge is released from these trap levels through the bottom insulating film 22a. When a charge is stored in the stacked insulating film, an electric field is generated by the stored charge and therefore the threshold voltage of the transistor changes. Therefore, a memory transistor with which storage of data becomes possible is obtained. For example, data is erased by storing a charge in the stacked insulating film and data is written by releasing the charge stored in the stacked insulating film.

The above semiconductor nonvolatile memory device, in the same way as the first embodiment, can realize a great reduction of cost by using a low price substrate such as a glass substrate and can form memory transistors capable of lowering the erase voltage and other voltages and capable of operating at a high speed. Particularly, by forming the semiconductor layer 31b by polycrystalline silicon or quasi single crystal silicon, the trap density in the semiconductor layer can be reduced and the gate swing value is reduced, so a further reduction of the erase voltage and other voltages is possible.

The semiconductor nonvolatile memory device of the present embodiment described above can be formed in the same way as with the method of production of the first embodiment except that, in place of the floating gate layer of polycrystalline silicon in the method of production of the first embodiment, silicon nitride is deposited by for example a CVD process to form the charge trap insulating film 24a. It is also possible to form the top insulating film 23a by depositing silicon oxide by for example a CVD process in place of the inter-layer insulating film of an ONO film.

In the present embodiment, it is also possible to use a silicon substrate coated on its surface with a silicon oxide film as the substrate. In this case, since the channel formation region is not formed in the silicon substrate, a silicon substrate which has the low quality and a price of ½ to ⅓ of the usual MOS LSI use silicon substrate can be used, therefore a great reduction of cost can be realized. Further, since a high temperature process such as a thermal oxidation process can be adopted, it becomes possible to form a high quality gate insulating film and tunnel insulating film.

Third Embodiment

Figure 9:
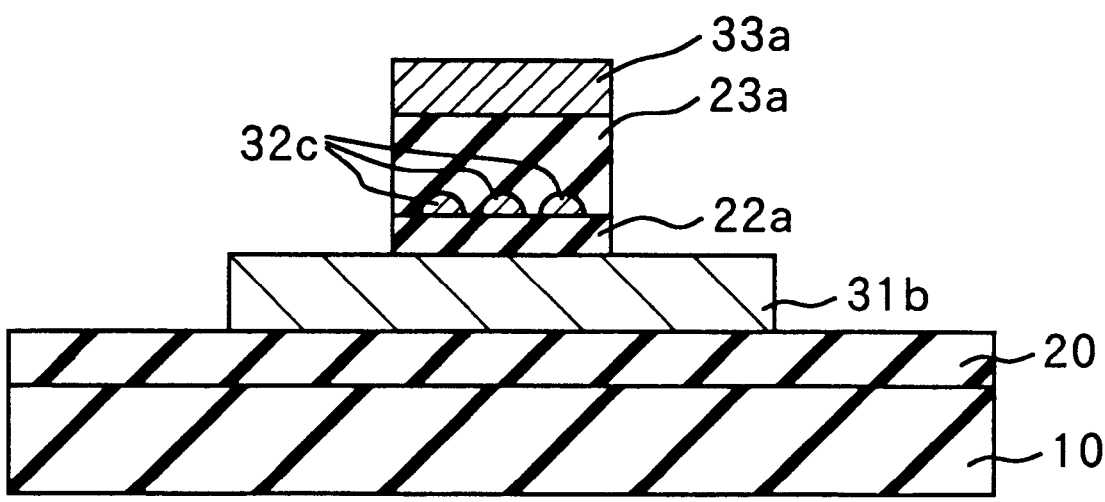
FIG. 9 is a sectional view of the semiconductor nonvolatile memory device according to a third embodiment of the present invention.

FIG. 9 is a sectional view of a semiconductor nonvolatile memory device ("TFT dot memory") of this present embodiment. It is substantially similar to the semiconductor nonvolatile memory device of the second embodiment except insulators 22a and 23a holding internally nanocrystals 32c made of conductors having an average particle size of 2 to 5 nm are formed as the charge storing layer. It can realize a great reduction of cost by using a low price substrate such as a glass substrate and can form memory transistors capable of lowering the erase voltage and other voltages and capable of operating at a high speed. Particularly, by forming the semiconductor layer 31b by polycrystalline silicon or quasi single crystal silicon, the trap density in the semiconductor layer can be reduced, the gate swing value is reduced, and therefore a further reduction of the erase voltage or other voltages is possible.

The semiconductor nonvolatile memory device of the present embodiment described above can be formed in the same way as with the method of production of the first embodiment except that, in place of the steps from the formation of the tunnel insulating film to the formation of the inter-layer insulating film in the method of production of the first embodiment, a silicon oxide film corresponding to the tunnel insulating film 22a and the inter-layer insulating film 23a is first formed, silicon ions are implanted while controlling the energy from the top surface to a position where a distance from the lower layer in the film is several nm and the Fowler Nordheim type tunnel current can be generated, and nanocrystals 32c are formed in the silicon oxide film corresponding to the tunnel insulating film 22a and the inter-layer insulating film 23a.

Fourth Embodiment

Figure 10:
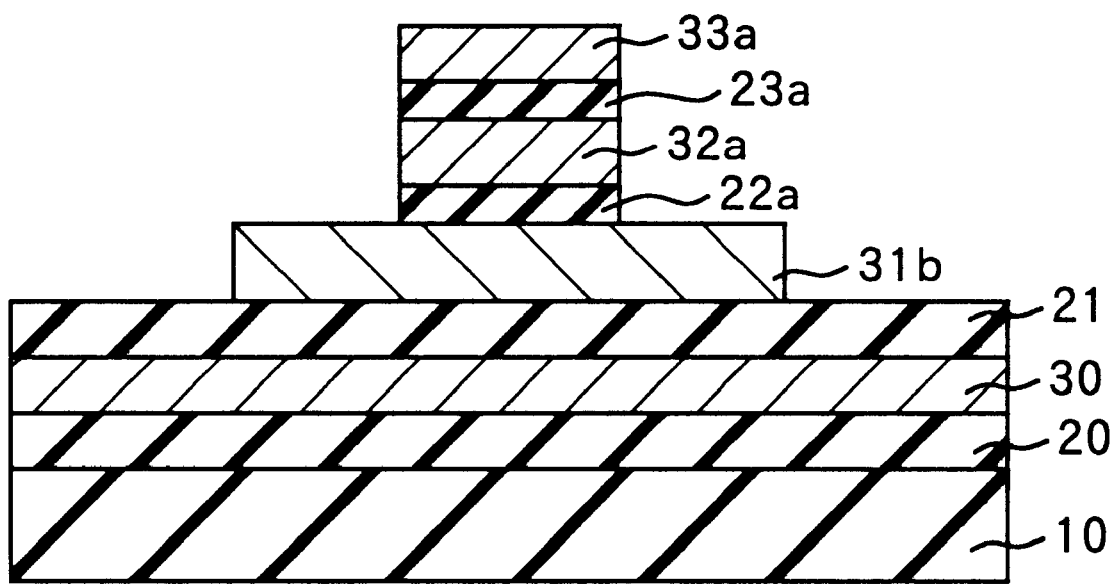
FIG. 10 is a sectional view of the semiconductor nonvolatile memory device according to a fourth embodiment of the present invention.

FIG. 10 is a sectional view of a semiconductor nonvolatile memory device of the present embodiment. For example, an underlying insulating film 20 made of for example silicon nitride or silicon oxide is formed at an upper layer of an insulating substrate 10 made of a glass substrate such as nonalkali glass or of a plastic substrate, and an erasing gate 30 made of a conductor such as a metal, for example, Cr or Mo, or polycrystalline silicon is formed at the upper layer thereof. A lower gate insulating film 21 made of for example silicon oxide is formed at an upper layer thereof. A semiconductor layer 31b made of for example polycrystalline silicon and having the channel formation region is formed at an upper layer thereof.

A tunnel insulating film 22a of a thin film made of for example silicon oxide is formed at an upper layer of the semiconductor layer 31b, a floating gate 32a made of for example polycrystalline silicon is formed at an upper layer thereof, an inter-layer insulating film 23a made of for example an ONO film (oxide-nitride-oxide stacked film) is formed at the upper layer thereof, and a control gate 33a made of for example polycrystalline silicon is formed at the upper layer thereof. Further, not illustrated source and drain diffusion layers connected to the channel formation region are formed in the semiconductor layer 31b. By this, a field effect transistor of a TFT structure is formed which has a floating gate 32a insulated by the insulating film between the control gate 33a and the channel formation region in the semiconductor layer 31b.

In the field effect transistor having the above structure, the floating gate 32a functions to hold a charge in the film, and the tunnel insulating film 22a and the inter-layer insulating film 23a have the role of sealing the charge in the floating gate 32a. By supplying an appropriate voltage to the control gate 33a and the not illustrated source and drain diffusion layers in the semiconductor layer 31b, a Fowler Nordheim type tunnel current is produced, electrons are injected from the semiconductor layer 31b into the floating gate 32a through the tunnel insulating film 22a, or electrons are released from the floating gate 32a to the semiconductor layer 31b. When a charge is stored in the floating gate 32a, an electric field is generated due to the stored charge, therefore the threshold voltage of the transistor changes, so a memory transistor with which storage of data becomes possible is obtained. For example, data can be erased by storing a charge in the floating gate 32a, and data can be written by releasing the charge stored in the floating gate 32a.

The above semiconductor nonvolatile memory device has the erase gate 30 at the lower layer of the semiconductor layer 31b via the lower gate insulating film 21. By supplying an erase voltage (for example positive voltage) to the erase gate 30, the data can be erased. Further, this erase gate 30 is formed connected to the erase gate of the adjoining memory transistor, so has a structure shared by the entire memory array or in units of blocks. Batch erasing of the entire memory array or for every erasing sector in units of blocks is therefore possible.

Figure 11:
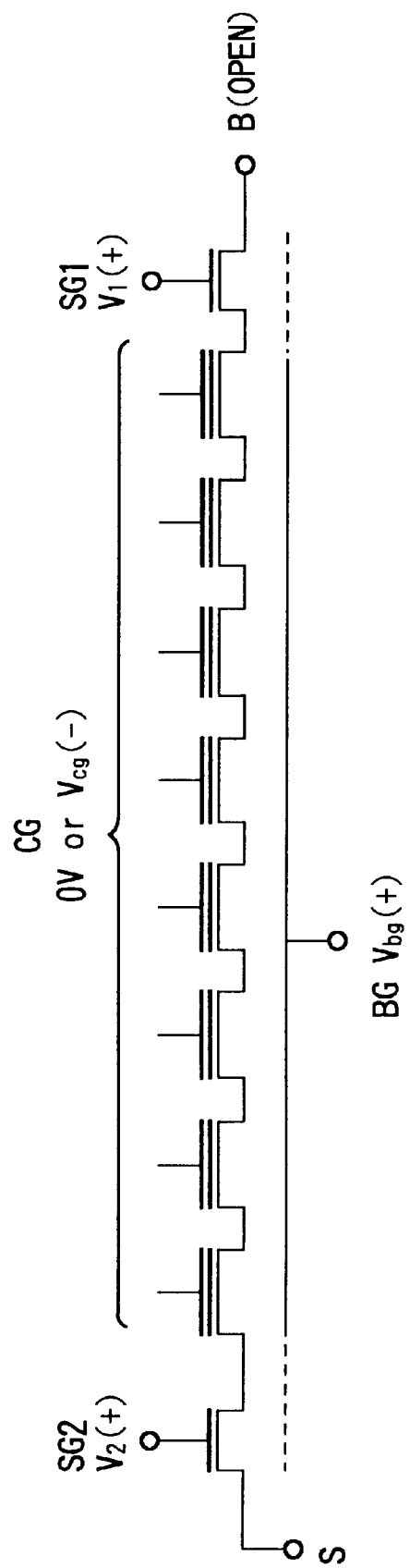
FIG. 11 is an equivalent circuit diagram for explaining the erase operation of the semiconductor nonvolatile memory device according to the fourth embodiment.

FIG. 11 is an equivalent circuit diagram of a NAND type semiconductor nonvolatile memory device in which eight memory transistors having the structure shown in FIG. 10 are connected in series. Two selection transistors for selecting the present NAND column are arranged at the two end portions of the NAND column constituted by the eight memory transistors. One of the source and drain diffusion layers of the present NAND column is connected to the bit line B, and the other is connected to the source line S. Further, erase gates are formed connected among the eight transistors. The erase gates can be given a structure shared by the entire memory array or in units of blocks. The number of connected memory transistors is not limited to eight and can be any number.

The NAND type semiconductor nonvolatile memory device described above has a configuration in which ½ of a contact for the data input/output is shared by eight memory cells and has 1/16 of a contact per cell. Similarly, also the selection gates and the source line are all shared by the eight cells. The surface area per cell therefore becomes near the area occupied by the memory transistor and therefore the memory cell area can be made very small, which is advantageous in the points of the increased degree of integration, enlarged capacity, and lowered cost.

As the method of erasing data in the NAND type semiconductor nonvolatile memory device described above, as shown in FIG. 11, 0V or a low voltage Vcg is supplied to all control gates CG of the NAND column, and high voltages V1 and V2 are supplied to the selection gates SG1 and SG2 of the two selection transistors. Further, the high voltage Vbg is supplied to the erase gate BG. Further, the source S and the bit line B are made open. By this, the data of the entire NAND column can be erased together by draining electrons in the floating gate by the Fowler Nordheim type tunnel phenomenon in the same way as the NOR type.

The semiconductor nonvolatile memory device of such a structure can realize a great reduction of costs by using a low price substrate such as a glass substrate and can form memory transistors capable of lowering the erase voltage and other voltages and capable of operating at a high speed. Particularly, by forming the semiconductor layer 31b by polycrystalline silicon or quasi single crystal silicon, the trap density in the semiconductor layer can be reduced, the gate swing value is reduced, and a further lowering of the erase voltage and other voltages is possible. Further, it is a semiconductor nonvolatile memory device having NAND type memory cells, which is advantageous in the point of the degree of integration, and has erase gates so can perform batch erasing of data.

In general, a structure having a conductor (erasing gate 30) via the insulator (lower gate insulating film 21) at the lower layer of the source and drain generates a capacity between the two which becomes a cause of lowering of the read speed, but since a TFT structure is used, the junction capacity is near zero. By making the thickness of the insulator (lower gate insulating film 21) between the source and drain and the conductor (erase gate 30) thick, while the erase voltage becomes higher, the capacitance can be made small. Further, for AV applications and data storage applications, cost and large capacity are priorities and demands on the read speed are not that high in many cases.

Figure 12A:
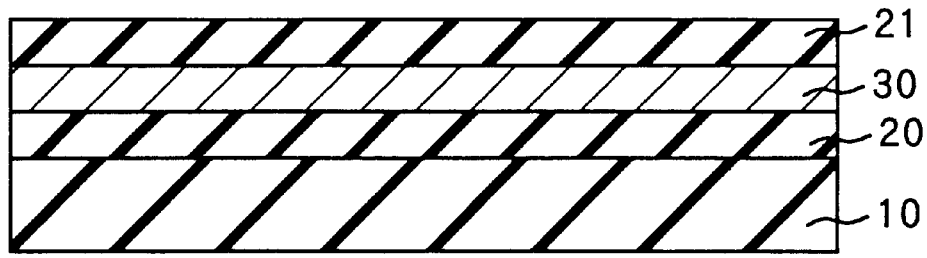

Next, an explanation will be made of the method of production of the semiconductor nonvolatile memory device of the present embodiment. First, as shown in FIG. 12A, an insulating substrate 10 made of a glass substrate such as nonalkali glass or of a plastic substrate is used. When using a substrate of a low melting point such as a glass substrate, the following steps are performed while setting the process temperature at not more than 600° C. For example, the insulating film is formed by a sputtering process or a chemical vapor deposition (hereinafter referred to as a "CVD") process. Silicon oxide, silicon nitride, or the like is deposited on this insulating substrate 10 by for example a CVD process to form the underlying insulating film 20. Next, a metal such as Cr or Mo is deposited at the upper layer thereof by for example a sputtering process, or polycrystalline silicon is deposited by a sputtering process, plasma enhanced CVD (PECVD) process, low pressure CVD process, or the like to form the erase gate 30. Next, an insulator such as silicon oxide or silicon nitride is deposited to a thickness of for example 20 nm at the upper layer thereof by for example a sputtering process or PECVD process (preferably PECVD process of bias ECR (electron cyclotron resonance) type) or the like to form the lower gate insulating film 21. The thinner this lower gate insulating film 21 become, the lower the erase voltage can be set.

Figure 12B:
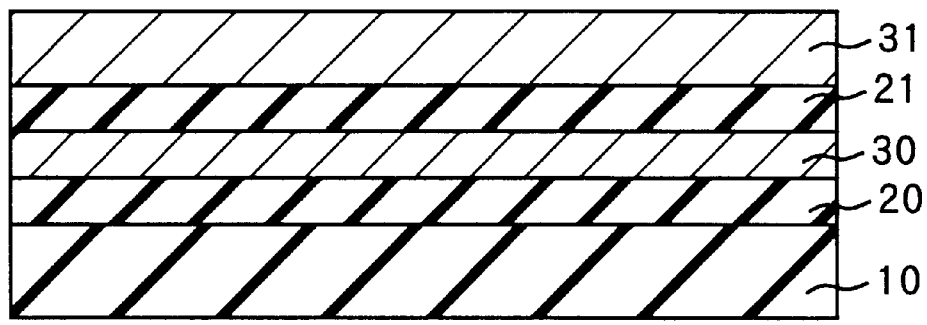

Next, as shown in FIG. 12B, amorphous silicon is deposited to a film thickness of 40 nm at the upper layer of the lower gate insulating film 21 by for example a sputtering process or CVD process to form the semiconductor layer 31. Particularly, according to the sputtering process or low pressure CVD process, there is little intake of hydrogen into the film—which becomes a cause of scattering of the insulating film and formation of holes when firing a laser beam in the later ELA step or the like. Further, according to the low pressure CVD process using $SiH_4$ or $Si_2H_6$ as the starting material, the silicon layer can be formed by a low temperature process of 500° C. or less.

Figure 12C:
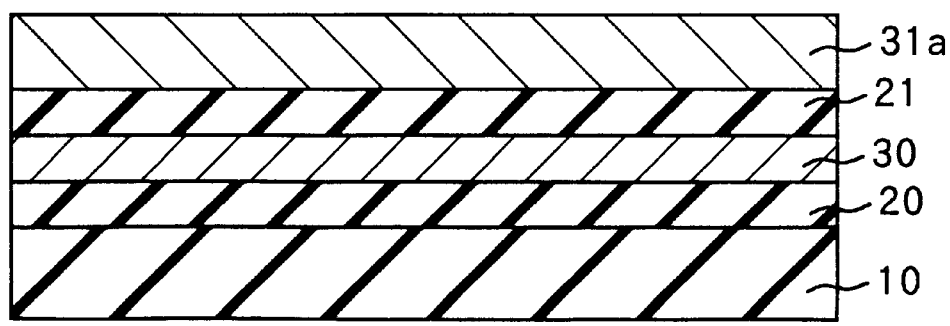

Next, as shown in FIG. 12C, the semiconductor layer 31 of amorphous silicon is crystallized by for example ELA processing to obtain the semiconductor layer 31a of polycrystalline silicon. As the ELA processing, various beam shot processes can be considered, but in a top gate TFT, the flatness, smoothness, and uniformity of the silicon film are considered important and a single shot or multishots for the chip as a whole is preferred. Further, since the erase gate 30 is in the lower layer and the heat efficiency is poor, crystallization may be carried out by heating the substrate to improve the crystallinity at high energy efficiency. For example, step-and-repeat ELA processing is for example performed by five shots of a uniform 2×2 $cm^2$ exciter laser beam at 400° C. with an energy of 300 $mJ/cm^2$. Further, it is also possible to perform this crystallization by a low temperature solid phase crystallization process (SPC) or ELA processing after the SPC processing.

Figure 13D:
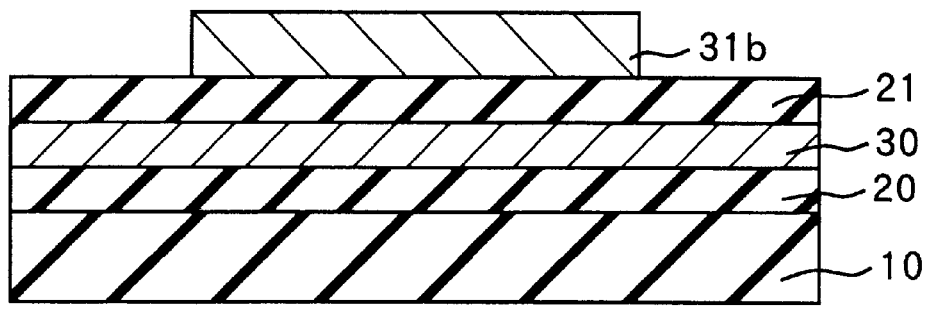

Next, as shown in FIG. 13D, a resist film is patterned and the semiconductor layer 31a is patterned by a photolithography processing to form the semiconductor layer 31b with elements isolated in the form of islands. Due to the TFT structure, in comparison with an element isolation process such as a LOCOS process usually used in a semiconductor device of the related art formed on a silicon wafer, the elements can be easily isolated.

Figure 13E:
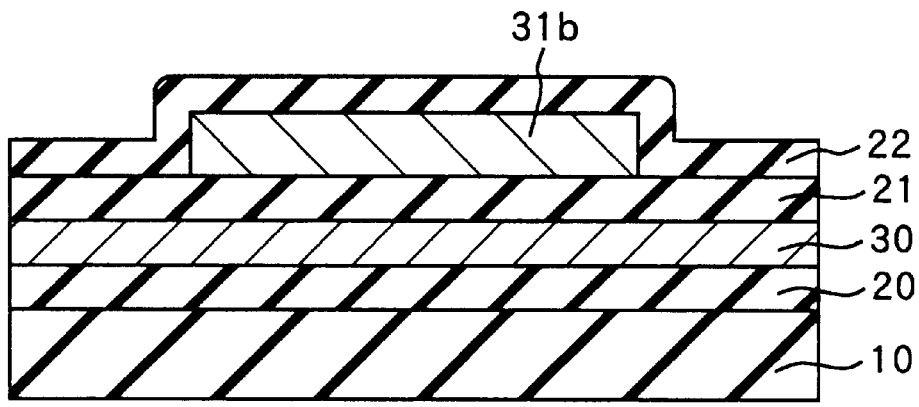

Next, as shown in FIG. 13E, silicon oxide is deposited to a thickness of about 9 nm by for example a plasma CVD process to form the tunnel insulating film 22. As the tunnel insulating film 22, a particularly high quality film is required, so in order to form this by a low temperature process, preferably it is formed by an ECR (electron cyclotron resonance) type plasma CVD process.

Figure 13F:
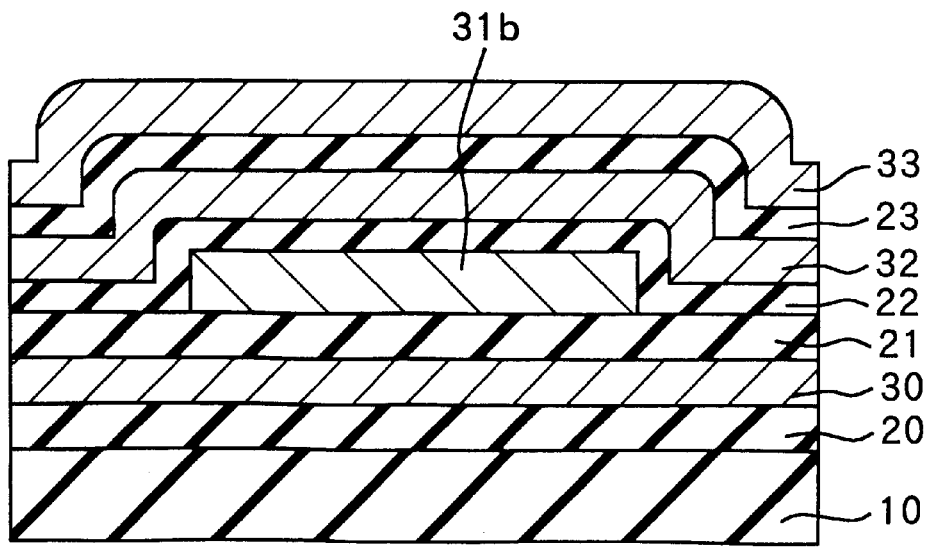

Next, as shown in FIG. 13F, polycrystalline silicon containing a conductive impurity is deposited at the upper layer of the tunnel insulating film 22 by for example a CVD process to form a floating gate layer 32. Alternatively, it is possible to deposit the polycrystalline silicon, then inplant ions of the conductive impurity. Next, for example, an ONO film (oxide-nitride-oxide stacked insulating film) is deposited on the entire surface coating the floating gate layer 32 by for example a CVD process to form an inter-layer insulating film 23. Next, polycrystalline silicon is deposited at the upper layer of the inter-layer insulating film 23 by for example a CVD process to form the control gate layer 33.

Next, a photolithography process is used for patterning to form the control gate 33a, inter-layer insulating film 23a, floating gate 32a, and tunnel insulating film 22a by self-alignment. Next, using the control gate as the mask, for example P ions are implanted at a dosage of for example $2 \times 10^{15}$ ions/cm$^2$ in the source and drain diffusion layer forming region to form the not illustrated source and drain diffusion layers. Further, annealing is performed by the ELA process or the RTA (rapid thermal annealing) process under conditions where the glass is not melted, for example, by line-like scanning, to activate the impurity ions of the source and drain diffusion layers. By the above, the device shown in FIG. 10 can be formed. As the steps after this, an inter-layer insulating film is formed coating the control gate 33a, contacts etc. are opened, and bit lines and other upper layer interconnections are formed to obtain the desired semiconductor nonvolatile memory device.

According to the method of production of a semiconductor nonvolatile memory device of this embodiment, since the TFTs acting as the memory transistors having the charge storage layers are formed on a low price insulating substrate such as glass, it is possible to produce a semiconductor nonvolatile memory device having memory transistors capable of lowering the erase voltage and other voltages and capable of operating at a high speed at a greatly reduced cost. Further, it is possible to form a structure having erase gates at the lower layer of the semiconductor layer via the lower gate insulating film and it is possible to produce a NAND type semiconductor nonvolatile memory device, which is advantageous in the point of the degree of integration, which is capable of batch erasing of the entire memory array or for every erasing sector in units of blocks, by adopting the structure where the erasing gates are shared by the entire memory array or in units of blocks.

In the above embodiment, it is also possible to use a silicon substrate coated on its surface with a silicon oxide film as the substrate. In this case, since the channel formation region is not formed in the silicon substrate, a silicon substrate having a low quality and having a price of ½ to ⅓ of the usual MOS LSI use silicon substrate can be used. Accordingly, a great reduction of cost can be realized. Further, a high temperature process such as a thermal oxidation process can be adopted, therefore it becomes possible to form a high quality gate insulating film and tunnel insulating film.

Fifth Embodiment

Figure 14:
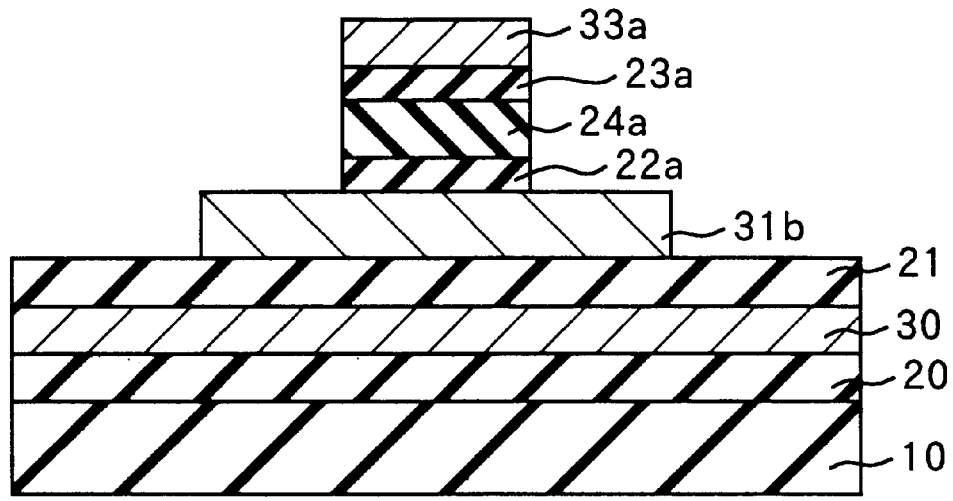
FIG. 14 is a sectional view of a semiconductor nonvolatile memory device according to a fifth embodiment of the present invention.
Figure 15:
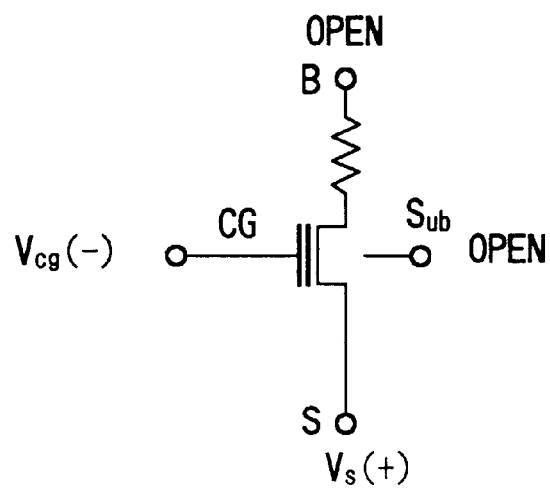
FIG. 15 is an equivalent circuit diagram for explaining the erase operation of a NOR type semiconductor nonvolatile memory device of an example of the prior art.
Figure 16:
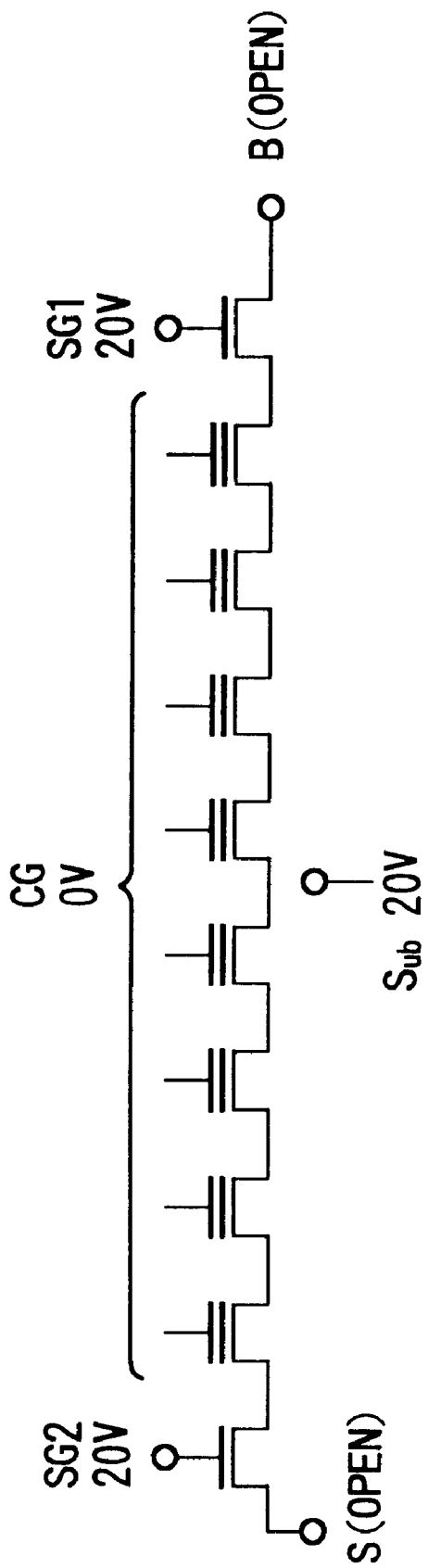
FIG. 16 is an equivalent circuit diagram for explaining the erase operation of a NAND type semiconductor nonvolatile memory device formed on a bulk silicon semiconductor substrate of the example of the prior art.

FIG. 14 is a sectional view of a semiconductor nonvolatile memory device of the present embodiment. It is substantially the same as the semiconductor nonvolatile memory device of the fourth embodiment except that, as the charge storing layer, a tunnel insulating film (bottom insulating film) 22a of a thin film made of for example silicon oxide is formed, charge traps insulating film 24a made of for example silicon nitride is formed at the upper layer thereof, and a top insulating film 23a made of for example silicon oxide is formed at the upper layer thereof. By using a low price substrate such as a glass substrate, it is possible to realize a great reduction of costs. It is also possible to obtain a memory transistor capable of lowering the erase voltage and other voltages and capable of operating at a high speed. Particularly, by forming the semiconductor layer 31b by polycrystalline silicon or quasi single crystal silicon, the trap density in the semiconductor layer can be reduced, the gate swing value is reduced, and a further lowering of the erase voltage or other voltage is possible. The semiconductor nonvolatile memory device has NAND type memory cells, which is advantageous in the point of the degree of integration, and has erase gates so can perform batch erasing of data.

The semiconductor nonvolatile memory device of the present embodiment can be formed in the same way as the method of production of the fourth embodiment except for depositing silicon nitride by for example a CVD process to form the charge trap insulating film 24a in place of the floating gate layer of polycrystalline silicon in the method of production of the fourth embodiment. Since the TFTs acting as the memory transistors having the charge storing layers are formed on a low price insulating substrate such as glass, it is possible to produce a semiconductor nonvolatile memory device having memory transistors capable of lowering the erase voltage and other voltages and capable of operating at a high speed while greatly lowering the costs. Further, it is possible to form a structure having erase gates at the lower layer of the semiconductor layer via the lower gate insulating film and it is possible to produce a NAND type semiconductor nonvolatile memory device, which is advantageous in the point of the degree of integration, which is capable of batch erasing of the entire memory array or for every erasing sector in units of blocks, by adopting the structure where the erasing gates are shared by the entire memory array or in units of blocks.

The semiconductor nonvolatile memory device of the present invention and the method of production of the same are not limited to the above embodiments. For example, in the second embodiment and the fifth embodiment, a memory transistor of a MONOS structure was adopted, but a MNOS structure can be adopted too. Further, the control gate and the floating gate were explained as being comprised of single layers, but two-layer configurations such as a laminate of polycrystalline silicon and tungsten silicide, that is, a "polycide", or a three or more layer multi-layer configurations may also be used. As the substrate, it is also possible to use a silicon substrate coated on its surface with a silicon oxide film other than the glass substrate and plastic substrate. Further, as the source and drain, various structures such as a LDD structure can be adopted. The injection of charges into the charge storing layer can correspond to any of the writing and erasing of the data. Other than this, various modifications are possible within the range not out of the gist of the present invention.

Summarizing the effects of the invention, according to the semiconductor nonvolatile memory device of the present invention, it is possible to realize a great reduction of costs by using a low price substrate such as a glass substrate and it is possible to obtain a memory transistor capable of lowering the erase voltage and other voltages and capable of operating at a high speed. Particularly, by forming the semiconductor layer 31b by polycrystalline silicon or quasi single crystal silicon, the trap density in the semiconductor layer can be reduced, the gate swing value is reduced, and a further lowering of the erase voltage or other voltages is possible. Further, the semiconductor nonvolatile memory device can be obtained which has NAND type memory cells, which is advantageous in the point of the degree of integration, and has erase gates, thereby can perform batch erasing of data.

According to the method of production of the semiconductor nonvolatile memory device of the present invention, the semiconductor nonvolatile memory device of the present invention described above can be easily manufactured. Since TFTs acting as the memory transistors having the charge storing layers are formed on a low price insulating substrate such as glass, it is possible to produce a semiconductor nonvolatile memory device having memory transistors capable of lowering the erase voltage and other voltages and capable of operating at a high speed while greatly lowering the costs. Further, it is possible to form a structure having erase gates at the lower layer of the semiconductor layer via the lower gate insulating film and it is possible to produce a NAND type semiconductor nonvolatile memory device, which is advantageous in the point of the degree of integration, which is capable of batch erasing of the entire memory array or for every erasing sector in units of blocks, by adopting the structure where the erasing gates are shared by the entire memory array or in units of blocks.

What is claimed is:

1. A semiconductor nonvolatile memory device in which memory transistors having charge storing layers are connected, said semiconductor nonvolatile memory device formed with a plurality of thin film transistors, each transistor comprising
a semiconductor layer having a channel formation region formed in an insulating substrate of glass or plastic,
a charge storing layer formed in the semiconductor layer,
a control gate formed at an upper layer of the charge storing layer, and
source and drain regions formed in the semiconductor layer and connected to the channel formation region,
each thin film transistor acting as a memory transistor.

2. A semiconductor nonvolatile memory device as set forth in claim 1, wherein said charge storing layer is a floating gate comprised of a conductor insulated by an insulating film.

3. A semiconductor nonvolatile memory device as set forth in claim 2, wherein said memory transistors are connected in a NOR type array.

4. A semiconductor nonvolatile memory device as set forth in claim 2, wherein said memory transistors are connected in a NAND type array.

5. A semiconductor nonvolatile memory device as set forth in claim 4, wherein each of the memory transistors comprises
a lower gate insulating film formed at a lower layer of the semiconductor layer and
an erase gate formed at a lower layer of the lower gate insulating film.

6. A semiconductor nonvolatile memory device as set forth in claim 5, wherein said erase gate is formed connected to at least an erase gate of an adjoining memory transistor.

7. A semiconductor nonvolatile memory device as set forth in claim 1, wherein said charging storing layer is an insulator having charge traps.

8. A semiconductor nonvolatile memory device as set forth in claim 7, wherein said insulator having charge traps is an oxide-nitride-oxide stacked insulating film or a nitride-oxide stacked insulating film.

9. A semiconductor nonvolatile memory device as set forth in claim 7, wherein said insulator having charge traps is an insulator holding internally nanocrystals comprised of conductors having an average particle size of 2 to 5 nm.

10. A semiconductor nonvolatile memory device as set forth in claim 7, wherein said memory transistors are connected in a NOR type array.

11. A semiconductor nonvolatile memory device as set forth in claim 7, wherein said memory transistors are connected in a NAND type array.

12. A semiconductor nonvolatile memory device as set forth in claim 11, wherein each of the memory transistors comprises
a lower gate insulating film formed at a lower layer of the semiconductor layer and
an erase gate formed at a lower layer of the lower gate insulating film.

13. A semiconductor nonvolatile memory device as set forth in claim 12, wherein said erase gate is formed connected to at least an erase gate of an adjoining memory transistor.

14. A semiconductor nonvolatile memory device as set forth in claim 1, wherein said semiconductor layer is formed by polycrystalline silicon or quasi single crystal silicon.

15. A semiconductor nonvolatile memory device as set forth in claim 14, wherein said substrate has a peripheral circuit transistor.

16. A semiconductor nonvolatile memory device as set forth in claim 15, wherein a gate width of a gate of the peripheral circuit transistor is larger than the gate length of the gate and the average particle size of the polycrystalline silicon or quasi single crystal silicon forming the semiconductor layer.

17. A semiconductor nonvolatile memory device as set forth in claim 14, wherein said charge storing layer is a floating gate comprised of a conductor insulated by an insulating film.

18. A semiconductor nonvolatile memory device as set forth in claim 17, wherein said memory transistors are connected in a NOR type array.

19. A semiconductor nonvolatile memory device as set forth in claim 17, wherein said memory transistors are connected in a NAND type array.

20. A semiconductor nonvolatile memory device as set forth in claim 19, wherein each of the memory transistors comprises
a lower gate insulating film formed at a lower layer of the semiconductor layer and
an erase gate formed at a lower layer of the lower gate insulating film.

21. A semiconductor nonvolatile memory device as set forth in claim 20, wherein said erase gate is formed connected to at least an erase gate of an adjoining memory transistor.

22. A semiconductor nonvolatile memory device as set forth in claim 14, wherein said charging storing layer is an insulator having charge traps.

23. A semiconductor nonvolatile memory device as set forth in claim 22, wherein said insulator having charge traps is an oxide-nitride-oxide stacked insulating film or a nitride-oxide stacked insulating film.

24. A semiconductor nonvolatile memory device as set forth in claim 22, wherein said insulator having charge traps is an insulator holding internally nanocrystals comprised of conductors having an average particle size of 2 to 5 nm.

25. A semiconductor nonvolatile memory device as set forth in claim 22, wherein said memory transistors are connected in a NOR type array.

26. A semiconductor nonvolatile memory device as set forth in claim 22, wherein said memory transistors are connected in a NAND type array.

27. A semiconductor nonvolatile memory device as set forth in claim 26, wherein each of the memory transistors comprises a lower gate insulating film formed at a lower layer of the semiconductor layer and an erase gate formed at a lower layer of the lower gate insulating film.

28. A semiconductor nonvolatile memory device as set forth in claim 27, wherein said erase gate is formed connected to at least an erase gate of an adjoining memory transistor.

29. A semiconductor nonvolatile memory device in which memory transistors having charge storing layers are connected, said semiconductor nonvolatile memory device formed with a plurality of thin film transistors, each transistor comprising a semiconductor layer formed by quasi single crystal silicon having a channel formation region formed in an insulating substrate of a silicon substrate covered on its surface with a silicon oxide film, a charge storing layer formed in the semiconductor layer, a control gate formed at an upper layer of the charge storing layer, and source and drain regions formed in the semiconductor layer and connected to the channel formation region, each thin film transistor acting as a memory transistor.

30. A semiconductor nonvolatile memory device as set forth in claim 29, wherein said substrate has a peripheral circuit transistor.

31. A semiconductor nonvolatile memory device as set forth in claim 30, wherein a gate width of a gate of the peripheral circuit transistor is larger than the gate length of the gate and the average particle size of the quasi single crystal silicon forming the semiconductor layer.

32. A semiconductor nonvolatile memory device as set forth in claim 29, wherein said charge storing layer is a floating gate comprised of a conductor insulated by an insulating film.

33. A semiconductor nonvolatile memory device as set forth in claim 32, wherein said memory transistors are connected in a NOR type array.

34. A semiconductor nonvolatile memory device as set forth in claim 32, wherein said memory transistors are connected in a NAND type array.

35. A semiconductor nonvolatile memory device as set forth in claim 34, wherein each of the memory transistors comprises a lower gate insulating film formed at a lower layer of the semiconductor layer and an erase gate formed at a lower layer of the lower gate insulating film.

36. A semiconductor nonvolatile memory device as set forth in claim 35, wherein said erase gate is formed connected to at least an erase gate of an adjoining memory transistor.

37. A semiconductor nonvolatile memory device as set forth in claim 29, wherein said charging storing layer is an insulator having charge traps.

38. A semiconductor nonvolatile memory device as set forth in claim 37, wherein said insulator having charge traps is an oxide-nitride-oxide stacked insulating film or a nitride-oxide stacked insulating film.

39. A semiconductor nonvolatile memory device as set forth in claim 37, wherein said insulator having charge traps is an insulator holding internally nanocrystals comprised of conductors having an average particle size of 2 to 5 nm.

40. A semiconductor nonvolatile memory device as set forth in claim 37, wherein said memory transistors are connected in a NOR type array.

41. A semiconductor nonvolatile memory device as set forth in claim 37, wherein said memory transistors are connected in a NAND type array.

42. A semiconductor nonvolatile memory device as set forth in claim 41, wherein each of the memory transistors comprises a lower gate insulating film formed at a lower layer of the semiconductor layer and an erase gate formed at a lower layer of the lower gate insulating film.

43. A semiconductor nonvolatile memory device as set forth in claim 42, wherein said erase gate is formed connected to at least an erase gate of an adjoining memory transistor.

44. A semiconductor nonvolatile memory device in which memory transistors having charge storing layers are connected, said semiconductor nonvolatile memory device formed with a plurality of thin film transistors, each transistor comprising a semiconductor layer formed by polycrystalline silicon having a channel formation region formed in an insulating substrate of a silicon substrate coated on its surface with a silicon oxide film, a charge storing layer formed in the semiconductor layer, a control gate formed at an upper layer of the charge storing layer, and source and drain regions formed in the semiconductor layer and connected to the channel formation region, each thin film transistor acting as a memory transistor, the substrate comprising a peripheral circuit transistor, the gate width of the gate of the peripheral circuit transistor being larger than the gate length of the gate and the average particle size of the polycrystalline silicon forming the semiconductor layer.

45. A semiconductor nonvolatile memory device as set forth in claim 44, wherein said charge storing layer is a floating gate comprised of a conductor insulated by an insulating film.

46. A semiconductor nonvolatile memory device as set forth in claim 45, wherein said memory transistors are connected in a NOR type array.

47. A semiconductor nonvolatile memory device as set forth in claim 45, wherein said memory transistors are connected in a NAND type array.

48. A semiconductor nonvolatile memory device as set forth in claim 47, wherein each of the memory transistors comprises a lower gate insulating film formed at a lower layer of the semiconductor layer and an erase gate formed at a lower layer of the lower gate insulating film.

49. A semiconductor nonvolatile memory device as set forth in claim 48, wherein said erase gate is formed connected to at least an erase gate of an adjoining memory transistor.

50. A semiconductor nonvolatile memory device as set forth in claim 44, wherein said charging storing layer is an insulator having charge traps.

51. A semiconductor nonvolatile memory device as set forth in claim 50, wherein said insulator having charge traps is an oxide-nitride-oxide stacked insulating film or a nitride-oxide stacked insulating film.

52. A semiconductor nonvolatile memory device as set forth in claim 50, wherein said insulator having charge traps is an insulator holding internally nanocrystals comprised of conductors having an average particle size of 2 to 5 nm.

53. A semiconductor nonvolatile memory device as set forth in claim 50, wherein said memory transistors are connected in a NOR type array.

54. A semiconductor nonvolatile memory device as set forth in claim 50, wherein said memory transistors are connected in a NAND type array.

55. A semiconductor nonvolatile memory device as set forth in claim 54, wherein each of the memory transistors comprises
- a lower gate insulating film formed at a lower layer of the semiconductor layer and
- an erase gate formed at a lower layer of the lower gate insulating film.

56. A semiconductor nonvolatile memory device as set forth in claim 55, wherein said erase gate is formed connected to at least an erase gate of an adjoining memory transistor.

57. A method of production of a semiconductor nonvolatile memory device in which memory transistors having charge storing layers are connected,
- said method of production of a semiconductor nonvolatile memory device comprising forming a thin film transistor acting as a memory transistor by
  - a step of forming a semiconductor layer having a channel formation region on an insulating substrate of glass or plastic;
  - a step of forming a charge storing layer at an upper layer of the semiconductor layer;
  - a step of forming a control gate at an upper layer of the charge storing layer; and
  - a step of forming source and drain regions connected to the channel formation region.

58. A method of production of a semiconductor nonvolatile memory device as set forth in claim 57, wherein the steps from the step of forming the semiconductor layer are performed at not more than 600° C.

59. A method of production of a semiconductor nonvolatile memory device as set forth in claim 57, wherein the step of forming the semiconductor layer includes a step of forming a silicon layer and a step of crystallizing the silicon layer by exciter laser annealing or low temperature solid phase crystallization.

60. A method of production of a semiconductor nonvolatile memory device as set forth in claim 59, wherein the step of forming the silicon layer is a step of formation by a CVD (chemical vapor deposition) method using $Si_2H_6$ as a starting material.

61. A method of production of a semiconductor nonvolatile memory device as set forth in claim 60, wherein said CVD method is a low pressure CVD method or a plasma CVD method.

62. A method of production of a semiconductor nonvolatile memory device as set forth in claim 59, wherein the step of forming the silicon layer is a step of formation by a CVD (chemical vapor deposition) method using $SiH_4$ as a starting material.

63. A method of production of a semiconductor nonvolatile memory device as set forth in claim 62, wherein said CVD method is a low pressure CVD method or a plasma CVD method.

64. A method of production of a semiconductor nonvolatile memory device as set forth in claim 59, wherein the step of forming the silicon layer is a step of formation by a sputtering method.

65. A method of production of a semiconductor nonvolatile memory device as set forth in claim 57, wherein the step of forming the charge storing layer includes a step of forming a gate insulating film at an upper layer of the semiconductor layer, a step of forming a floating gate comprised of a conductor at an upper layer of the gate insulating film, and a step of forming an inter-layer insulating film at an upper layer of the floating gate.

66. A method of production of a semiconductor nonvolatile memory device as set forth in claim 65, wherein the memory transistors are formed connected in a NOR type array.

67. A method of production of a semiconductor nonvolatile memory device as set forth in claim 65, wherein the memory transistors are formed connected in a NAND type array.

68. A method of production of a semiconductor nonvolatile memory device as set forth in claim 67, which further comprises, before the step of forming the semiconductor layer, a step of forming an erase gate on the insulating substrate and a step of forming a lower gate insulating film on the erase gate.

69. A method of production of a semiconductor nonvolatile memory device as set forth in claim 57, wherein the step of forming the charge storing layer is a step of forming an insulator having charge traps at an upper layer of the semiconductor layer.

70. A method of production of a semiconductor nonvolatile memory device as set forth in claim 69, wherein the memory transistors are connected in a NOR type array.

71. A method of production of a semiconductor nonvolatile memory device as set forth in claim 69, wherein the memory transistors are formed connected in a NAND type array.

72. A method of production of a semiconductor nonvolatile memory device as set forth in claim 71, which further comprises, before the step of forming the semiconductor layer, a step of forming an erase gate on the insulating substrate and a step of forming a lower gate insulating film on the erase gate.

73. A method of production of a semiconductor nonvolatile memory device comprising a first transistor acting as a memory transistor having a charge storing layer and a second transistor for a peripheral circuit,
- said method of production of a semiconductor nonvolatile memory device comprising:
  - a step of forming a first semiconductor layer having a first channel formation region for the first transistor in a first transistor forming region and forming a second semiconductor layer having a second channel formation region for the second transistor in a second transistor forming region on an insulating substrate of a silicon substrate coated on its surface with a silicon oxide film or on an insulating substrate of glass or plastic;
  - a step of forming a charge storing layer at an upper layer of the first semiconductor layer and forming a gate insulating film at an upper layer of the second semiconductor layer;

a step of forming a control gate at an upper layer of the charge storing layer and forming a gate electrode at an upper layer of the gate insulating film; and a step of forming first source and drain regions connected to a first channel formation region and second source and drain regions connected to a second channel formation region.

74. A method of production of a semiconductor nonvolatile memory device as set forth in claim 73, wherein the step of forming the charge storing layer at an upper layer of the first semiconductor layer includes a step of forming a tunnel insulating film at an upper layer of the first semiconductor layer, a step of forming a floating gate at an upper layer of the tunnel insulating film, and a step of forming an interlayer insulating film at an upper layer of the floating gate.

75. A method of production of a semiconductor nonvolatile memory device as set forth in claim 73, wherein the step of forming the charge storing layer at an upper layer of the first semiconductor layer is a step of forming an insulator having charge traps at an upper layer of the first semiconductor layer.

76. A method of production of a semiconductor nonvolatile memory device comprising a first transistor having a charge storing layer and a second transistor for a peripheral circuit, said method of production of a semiconductor nonvolatile memory device comprising:

a step of forming an erase gate in a first transistor forming region on an insulating substrate of a silicon substrate coated on its surface with a silicon oxide film or on an insulating substrate of glass or plastic;

a step of forming a lower gate insulating film at an upper layer of the erase gate;

a step of forming a first semiconductor layer having a first channel formation region for the first transistor at an upper layer of the lower gate insulating film and forming a second semiconductor layer having a second channel formation region for the second transistor in a second transistor forming region on the substrate;

a step of forming a charge storing layer at an upper layer of the first semiconductor layer and forming a gate insulating film at an upper layer of the second semiconductor layer;

a step of forming a control gate at an upper layer of the charge storing layer and forming a gate electrode at an upper layer of the gate insulating film; and a step of forming first source and drain regions connected to the first channel formation region and second source and drain regions connected to the second channel formation region.

* * * * *